(12) United States Patent
Wang et al.

(10) Patent No.: US 8,884,640 B2
(45) Date of Patent: Nov. 11, 2014

(54) INTEGRATED HIGH-SPEED PROBE SYSTEM

(75) Inventors: Chun-Chi Wang, Hsinchu Hsiang (TW);
Chia-Tai Chang, Hsinchu Hsiang (TW);
Ya-Yun Cheng, Hsinchu Hsiang (TW);
Wei-Cheng Ku, Hsinchu Hsiang (TW);
Chao-Ping Hsieh, Hsinchu Hsiang (TW)

(73) Assignee: MPI Corporation, Chu-Pei (TW)

( * ) Notice: Subject to any disclaimer, the term of this patent is extended or adjusted under 35 U.S.C. 154(b) by 238 days.

(21) Appl. No.: 13/450,460

(22) Filed: Apr. 18, 2012

(65) Prior Publication Data

US 2012/0274347 A1  Nov. 1, 2012

(30) Foreign Application Priority Data

Apr. 28, 2011  (TW) .............................. 100114901 A
Feb. 2, 2012  (TW) .............................. 101103399 A
Mar. 15, 2012  (TW) .............................. 101108901 A

(51) Int. Cl.
*G01R 31/02* (2006.01)
*G01R 31/28* (2006.01)
*G01R 1/067* (2006.01)

(52) U.S. Cl.
CPC ........ *G01R 1/06772* (2013.01); *G01R 31/2889* (2013.01)

USPC ......................... 324/755.02; 29/882; 324/754

(58) Field of Classification Search
CPC ..... G01R 131/02; G01R 131/26; G01R 1/073
USPC ..................... 324/754, 755, 761; 29/876, 882
See application file for complete search history.

(56) References Cited

U.S. PATENT DOCUMENTS

| | | | |
|---|---|---|---|
| 7,240,432 B2 * | 7/2007 | Maruyama et al. | 29/882 |
| 7,368,928 B2 * | 5/2008 | Lin et al. | 324/756.03 |
| 7,482,823 B2 * | 1/2009 | Gleason et al. | 324/750.26 |
| 2008/0007278 A1 * | 1/2008 | Ku et al. | 324/754 |

* cited by examiner

*Primary Examiner* — Arleen M Vazquez
*Assistant Examiner* — Neel Shah
(74) *Attorney, Agent, or Firm* — Ding Yu Tan

(57) ABSTRACT

An integrated high-speed probe system is provided. The integrated high-speed probe system includes a circuit substrate for transmitting low-frequency testing signals from a tester through a first probe of the probe assembly to a DUT, and a high-speed substrate for transmitting high-frequency testing signals from the tester to the DUT. The high-speed substrate extends from the upper surface of the circuit substrate in the testing area to the lower surface of the circuit substrate in the probe area for being adjacent to the probe assembly and electrically connecting the second probe. In this way, the tester can transmit testing signals of different frequencies through the integrated high-speed probe system.

21 Claims, 21 Drawing Sheets

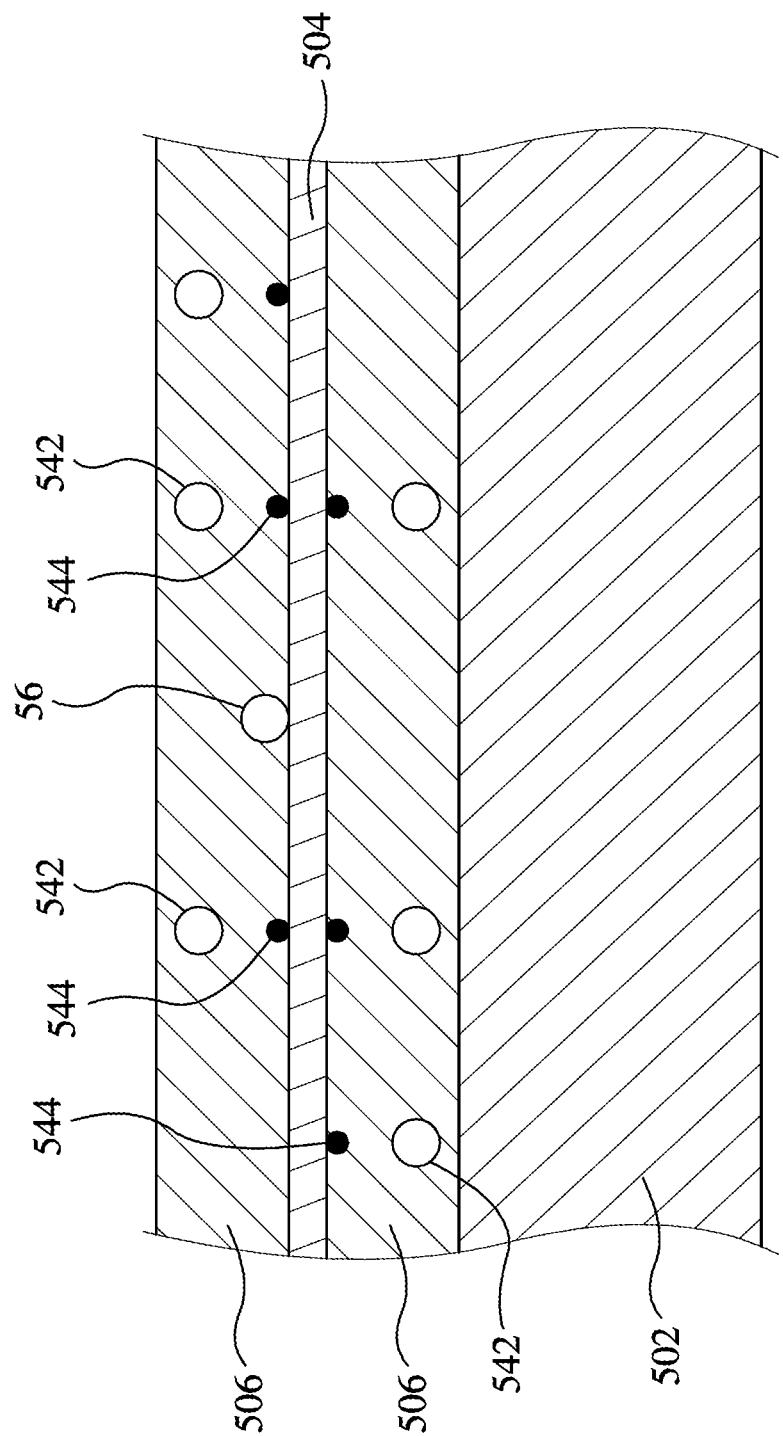

INTEGRATED HIGH-SPEED PROBE SYSTEM

FIELD OF THE INVENTION

The present invention relates to a probe system for high-speed testing, and more particularly, to an integrated high-speed probe system capable of transmitting testing signals of low/high-frequency between a tester and a device under test (DUT).

BACKGROUND OF THE INVENTION

In semiconductor manufacture for automatic wafer-level testing, a tester is used to transmit testing signals to a device under test (DUT), e.g. an integrated circuit (IC), and to read the testing result from the DUT. However, since the pin pitch of the DUT is relatively small to that of the tester, a probe system is required to be disposed between the DUT and the tester for space transforming. In this way, the testing signals from the tester can be transmitted to the testing pads of the DUT through the circuit and probes of the probe system, and the testing result from the DUT can be transmitted back to the tester through the probes and the circuit of the probe system for the tester to determine if the DUT has failed or not.

For those DUTs of high-speed/high-frequency operation or DUTs having high-frequency/low-frequency mixed operations, the layout on the circuit substrate for the circuit of the probe system has to be designed specifically in order to meet the requirement of impedance matching on the transmission paths for the high-frequency signals because the high-frequency signals are highly sensitive to the transmission environment. If the impedance of each component in the probe system does not exactly match to one another, signal reflection loss at the conjunctions between each component then occurs, which thereby deteriorates the reliability of the probe system.

However, for the sake of mass production, the probe system manufacturer applies standard circuit substrates to fabricate circuits of all types of probe systems. Since testing contacts on such standard circuit substrate are fixed, hand wires, acting as signal transmission paths between the tester and the probes, are required for the standard circuit substrate to be able to apply to different kinds of probe systems. Consequently, such design cannot meet the impedance requirement for high-frequency transmission and therefore is only adapted to low-frequency/medium-frequency transmissions. That is, the probe system manufacturer can utilize the standard circuit substrate for DUTs of low-frequency/medium-frequency operations, but the probe system manufacturer has to use another customized circuit substrate for DUTs of high-frequency operations or low-frequency/medium-frequency/high-frequency mixed operations since the high-frequency transmission requires impedance matching on the signal transmission paths. Even if the probe system manufacturer utilizes a customized circuit substrate for the probe system to test DUTs of same frequency requirements, the probe system manufacturer still has to re-design the customized circuit substrate whenever the layouts of the DUTs are changed, which thereby increases the overall costs.

Taiwan patent publication No. 1266882 discloses a probe system for providing signal paths between the tester and the DUT. The probe system disposes an additional area on the circuit substrate, and this additional area is only for receiving the high-frequency signals through the additional flex cables. In other words, the circuit substrate of the probe system is divided into two areas: one area is for low-frequency signals/medium-frequency signals, and the other area is only for high-frequency signals. Consequently, the tester has to separate the positions for the low-frequency testing signals/medium-frequency testing signals and the positions for the high-frequency testing signals into two different areas, which affects the layout for low-frequency/medium-frequency transmission on the circuit substrate and diminishes the amount of circuit space required by the high-frequency transmission paths. Meanwhile, the extending of the flex cables from the circuit substrate into the high-density probe area directly generates resistance to the resilience of the probes, especially for those probe structures requiring specific resilience, which causes the resilient force/reaction force between one testing pad of the DUT and its corresponding probe to be different from the resilient force/reaction force between another testing pad of the DUT and its corresponding probe. Under such usage condition, after a period of time, resilience of all probes will be different to each other, which deteriorates the electrical connections between the probe system and the DUT and thereby decreases the testing reliability. Furthermore, if the DUT has more components having different high-frequency requirements, the above probe system needs to install more flex cables at different places of the circuit substrate for transmitting those high-frequency signals to those components of the DUT so that more flex cables are inserted into the high-density probe area, and more resistance to the probes is generated. Besides, if any flex cable is moved, for example, as when touched by the operator, all probes will be misplaced or even damaged, and then the testing procedure has to be stopped until the probe system is completely repaired.

Therefore, it is quite a problem for the probe system manufacturer to provide the probe system having the higher transmission quality for low-frequency/medium-frequency/high-frequency testing signals with the shortest lead time and the lower cost.

SUMMARY OF THE INVENTION

The present invention provides an integrated high-speed probe system for transmitting a grounding voltage level, a first testing signal, and a second testing signal from a tester for testing a device under test (DUT). The first testing signal has a first frequency different from a second frequency of the second testing signal. The integrated high-speed probe system comprises a circuit substrate, a high-speed substrate, and a probe assembly. The circuit substrate is being divided into a probe area and a testing area from a center of the circuit substrate to a periphery of the circuit substrate, the circuit substrate comprising an upper surface; a lower surface; a plurality of first testing contacts on the upper surface within the testing area for transmitting the first testing signal or the grounding voltage level; and a plurality of first probe contacts on the lower surface within the probe area for electrically connecting the plurality of the first probe contacts. The high-speed substrate extending from the upper surface of the circuit substrate in the testing area to the lower surface of the circuit substrate in the probe area by passing through the circuit substrate for being adjacent to the center of the circuit substrate. The high-speed substrate comprises a contacting layer comprising a plurality of second testing contacts configured on the upper surface of the circuit substrate; a grounding layer for receiving the grounding voltage level; and a plurality of signal wires electrically connected the plurality of the second testing contacts for transmitting the second testing signal. At least one of the plurality of the second testing contacts is aligned with a corresponding first testing contact of the circuit substrate. The probe assembly comprises a locating base; at least a grounding probe located on the locating base for electrically connecting the grounding layer of the high-speed substrate; a plurality of first probes, each first probe electrically connected to a corresponding first probe contact of the circuit substrate; a plurality of second probes, each second probe electrically connected a corresponding signal wire of the high-speed substrate.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 10A and FIG. 10B are diagrams illustrating dispositions for the second probe in the probe assembly of the present invention in FIG. 2.

DETAILED DESCRIPTION OF THE INVENTION

The present invention is directed to a probe system for providing signal paths between an integrated circuit (IC) tester and input/output (I/O), power and ground pads of one or more ICs to be tested, e.g. DUTs either while the ICs are still in the form of die on a semiconductor wafer or after they have been separated from one another. The specification describes exemplary embodiments and applications of the invention considered by the applicant(s) to be the best modes of practicing the invention. It is not intended, however, that the invention be limited to exemplary embodiments described below or to the particular manner in which the embodiments operate.

Figure 1:
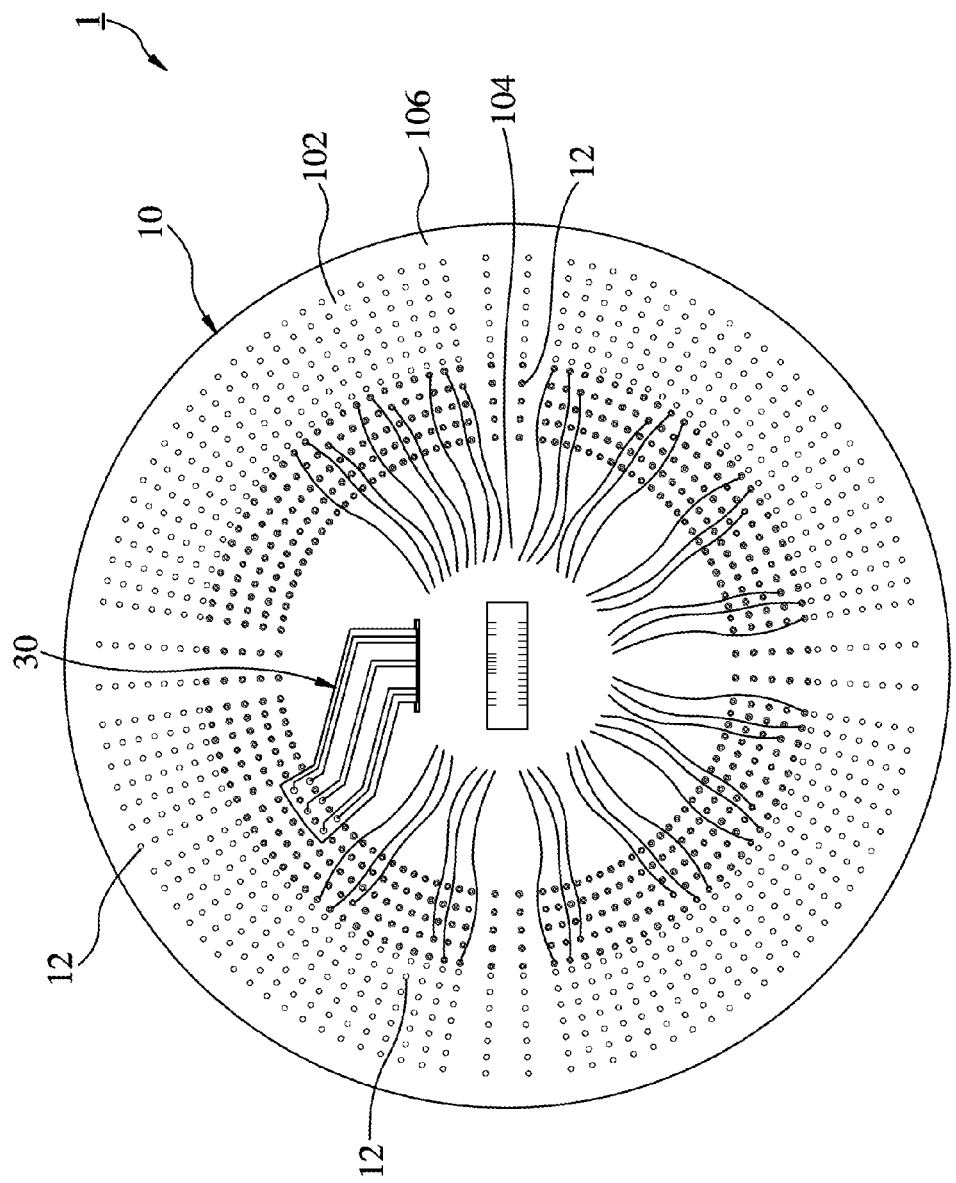
FIG. 1 is a diagram illustrating top view of the first embodiment of the present invention.
Figure 2:
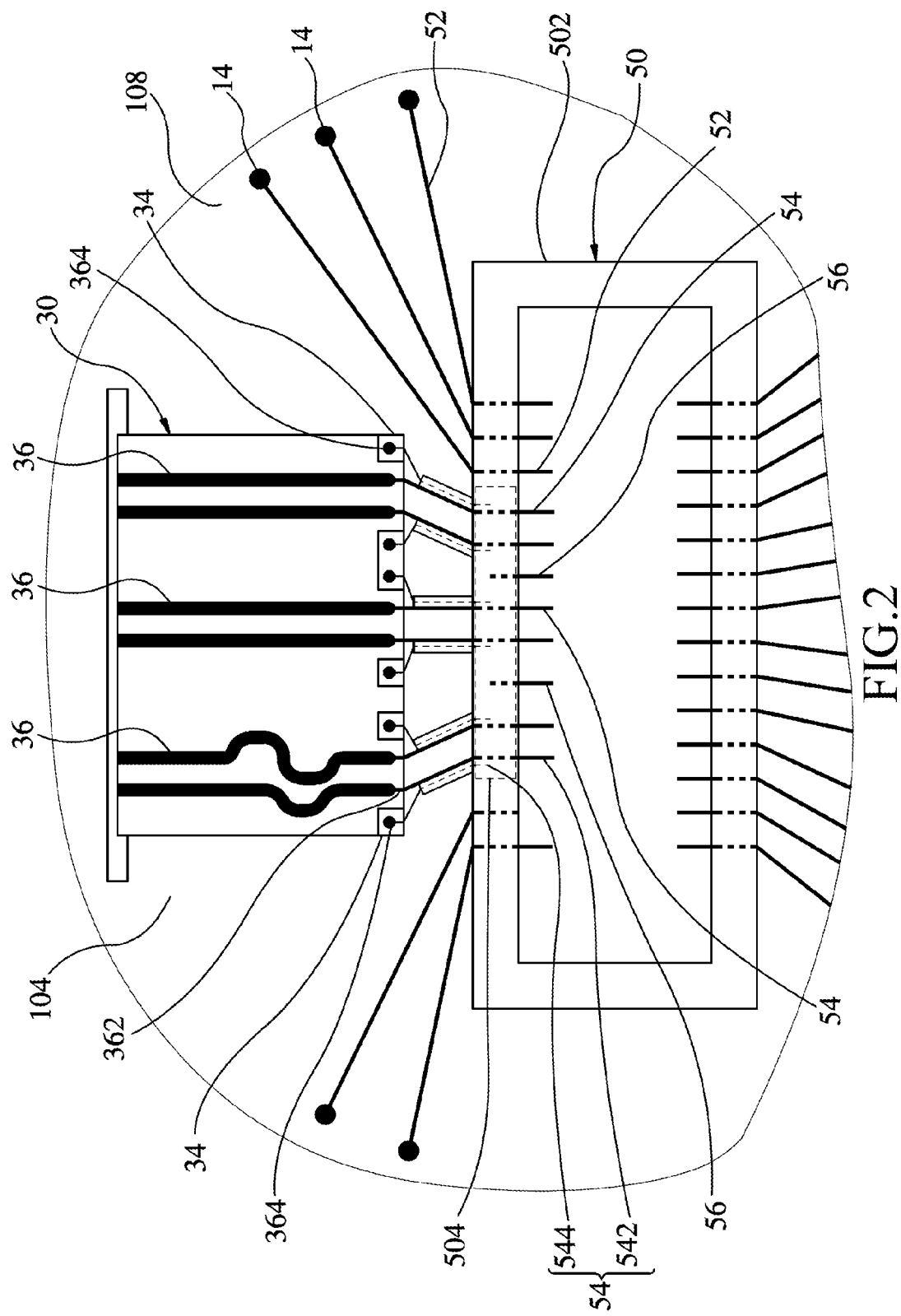
FIG. 2 is a diagram illustrating partial bottom view of the first embodiment of the present invention.
Figure 3:
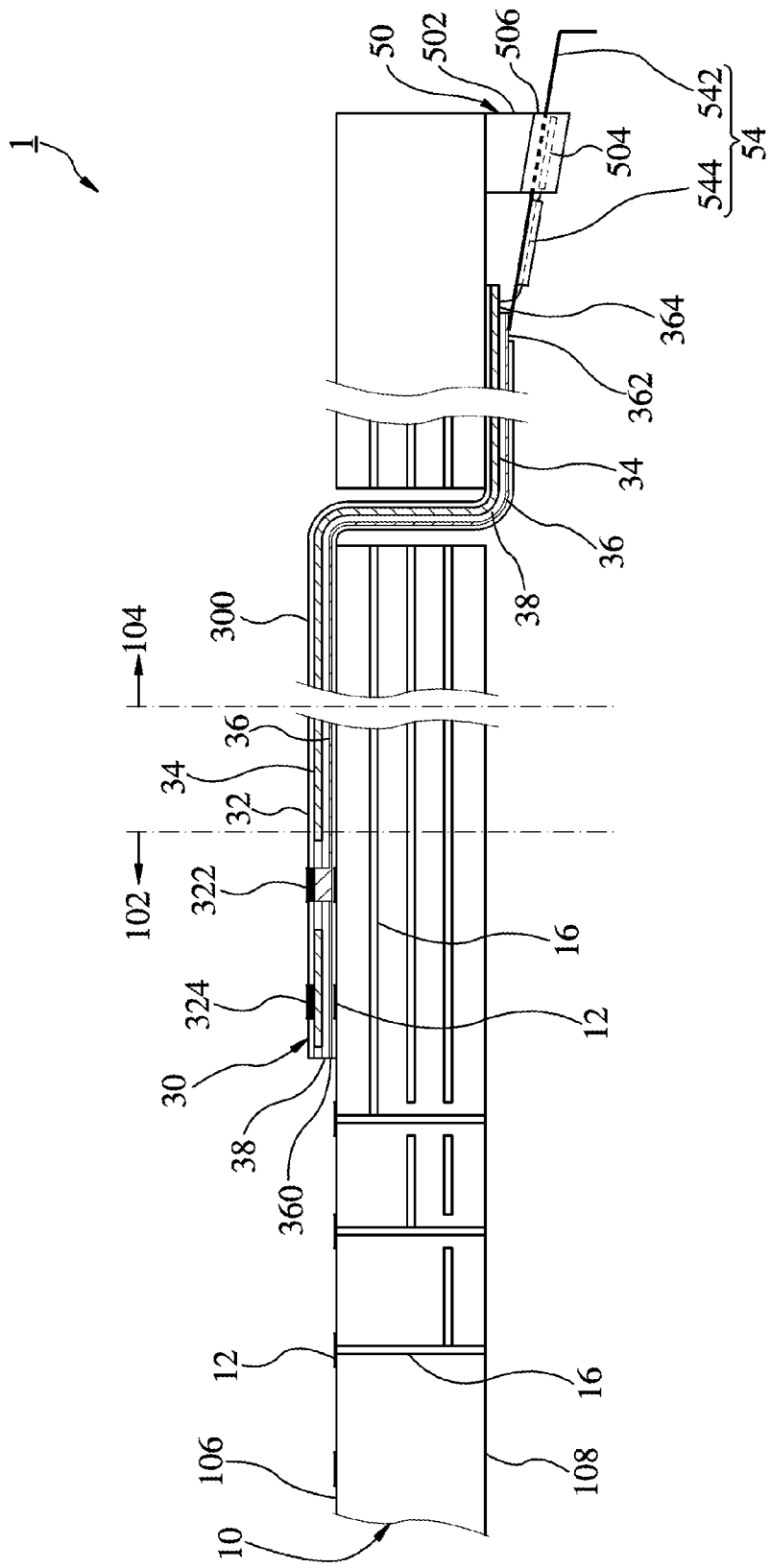
FIG. 3 is a diagram illustrating the structure of the first embodiment of the present invention.

Please refer to FIGS. 1-3. FIGS. 1-3 show an integrated high-speed probe system 1 according to a first embodiment of the present invention. The integrated high-speed probe system 1 can be applied to DUTs of different frequency bands, e.g. a low-frequency band, a medium-frequency band, or a high-frequency band so that a tester can transmit low-frequency testing signals and/or high-frequency testing signals to DUTs through the integrated high-speed probe system 1 for testing. For transmitting a high-frequency testing signal, impedance of each section of the transmission path where the high-frequency testing signal is travelling has to be matched to each other. Thus, a grounding voltage level is needed to be provided along the transmission path for impedance matching, which is one of the features of the present invention. The integrated high-speed probe system 1 comprises a circuit substrate 10, a high-speed substrate 30, and a probe assembly 50. From periphery to center, the circuit substrate 10 is divided to into a testing area 102 and a probe area 104. The circuit substrate 10 comprises a plurality of first testing contacts 12 on an upper surface 106 of the circuit substrate 10 within the testing area 102 and a plurality of first probe contacts 14 on the lower surface 108 of the circuit substrate 10 within the probe area 104. The first testing contact 12 electrically connects one corresponding first probe contact 14 through a hand wire or one first signal wire 16 disposed in the circuit substrate 10 for transmitting a "low-frequency testing sitmal" (referred to as "first testing signal" hereinafter) or a grounding voltage level from the tester.

The high-speed substrate 30 is disposed on the upper surface 106 and the lower surface 108 of the circuit substrate 10 for transmitting the "high-frequency testing signal" (referred to "a second testing signal" hereinafter) from the tester. More particularly, the high-speed substrate 30 extends from the upper surface 106 of the circuit substrate 10 in the testing area 102 to the lower surface 108 of the circuit substrate 10 in the probe area 104 by passing through the circuit substrate 10 so as to be adjacent to edges of the probe assembly 50. In other words, one part of the high-speed substrate 30 is disposed on the upper surface 106, while another part of the high-speed substrate 30 passes through the circuit substrate 10, and the other part of the high-speed substrate 30 is disposed on the lower surface 108 so as to be adjacent to the probe assembly 50. The high-speed substrate 30 can be realized by one single flexible printed circuit (FPC) substrate 300 as shown in the present embodiment. By utilizing the FPC substrate 300, the second testing signal can be transmitted from the upper surface 106 within the testing area 102 to the lower surface 108 within the probe area 104, or transmitted from the lower surface 108 within the probe area 104 to the upper surface 106 of the testing area 102. As shown in FIG. 3, the high-speed substrate 30 covers a part of the testing area 102 on the upper surface 106 of the circuit substrate 10, and the high-speed substrate 30 comprises a contacting layer 32, a grounding layer 34, and a plurality of signal wires 36. Therefore, the second testing signal from the tester is received by the contacting layer 32 within the testing area 102, and transmitted to the probe assembly 50 through the signal wire 36. The features and functions of the contacting layer 32, the grounding layer 34, and the signal wires 36 are described as follow.

Figure 4:
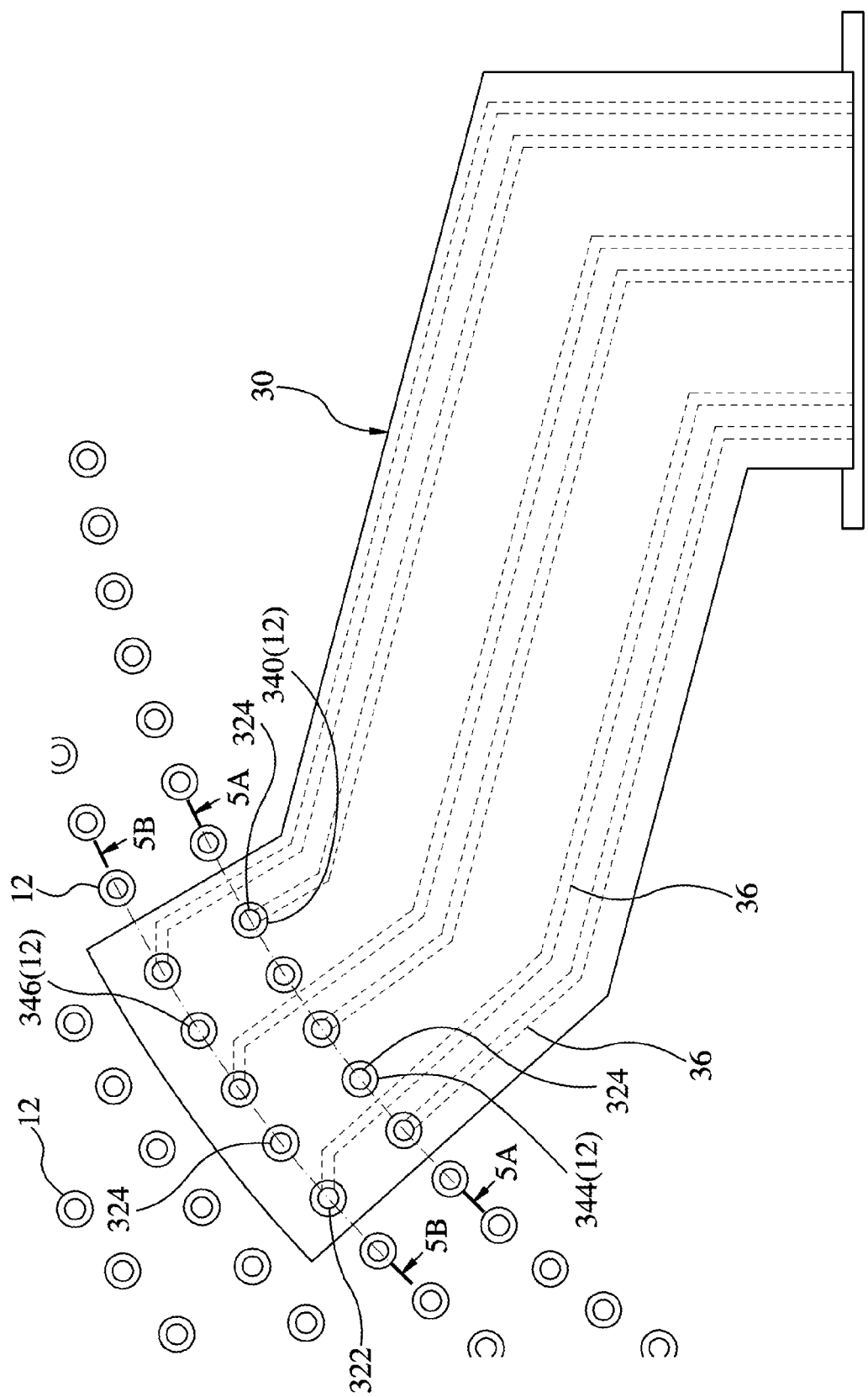
FIG. 4 is a diagram illustrating partial top view of the first embodiment of the present invention for showing the disposition of the high-speed substrate and the circuit substrate.

The contacting layer 32 comprises a plurality of second testing contacts 322 and a plurality of grounding contacts 324 disposed on the upper surface 106, and the contacting layer 32 provides electrical insulation to the surface of the high-speed substrate 30. At least one grounding contact 324 and at least one second testing contact 322 are aligned with the first testing contacts 12 of the circuit substrate 10. In other words, at least one grounding contact 324 is positioned according to the position of one corresponding first testing contact 12 of the circuit substrate 10, and at least one second testing contact 322 is positioned according to the position of another corresponding first testing contact 12 of the circuit substrate 10. Preferably, as shown in FIG. 4, one second testing contact 322 is aligned with one corresponding first testing contact 12 and electrically insulated to the corresponding first testing contact 12; one grounding contact 324 is aligned with another corresponding first testing contact 12. Since the position of the second testing contact 322 is the same as the position of the first testing contact 12 with respective to the tester, the tester can utilize the same original disposition of only transmitting the first testing signal to transmit the first and second testing signals at the same time, and the second testing signals are only transmitted through the high-speed substrate 30 which meets the requirement for high-frequency transmission.

Figure 5A:
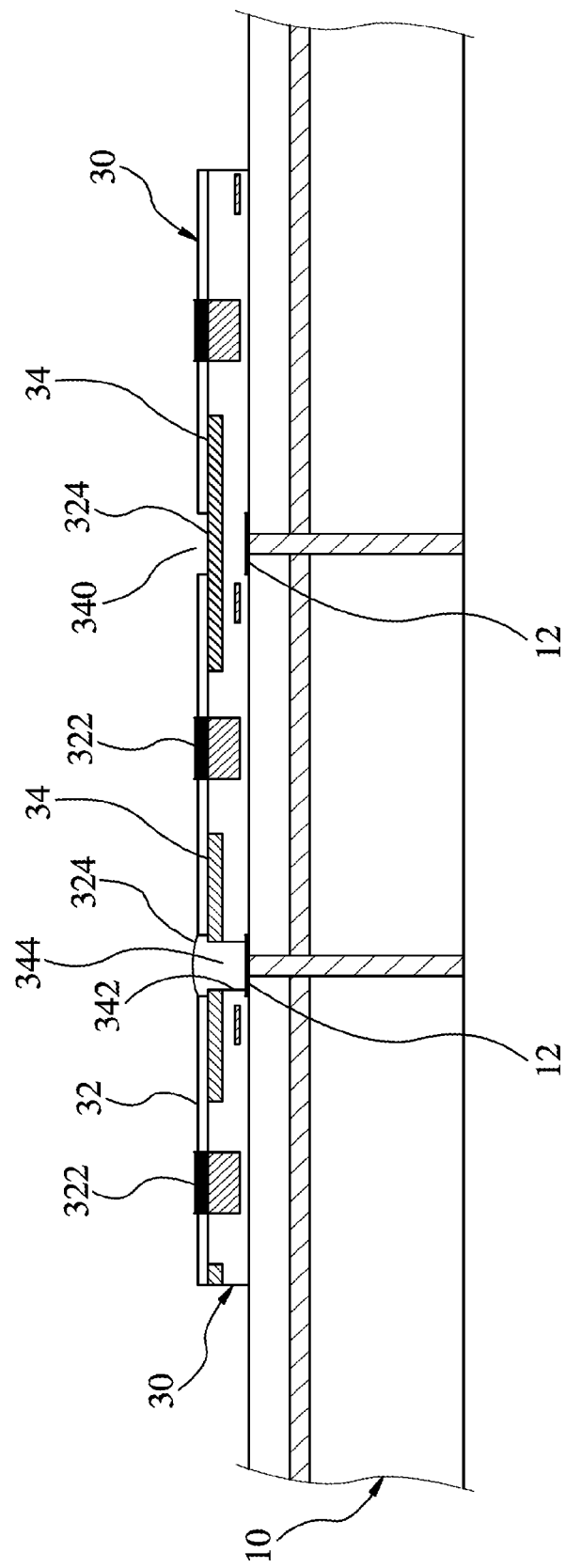
FIG. 5A is a diagram illustrating cross-sectional view along the line 5A-5A in FIG. 4.
Figure 5B:
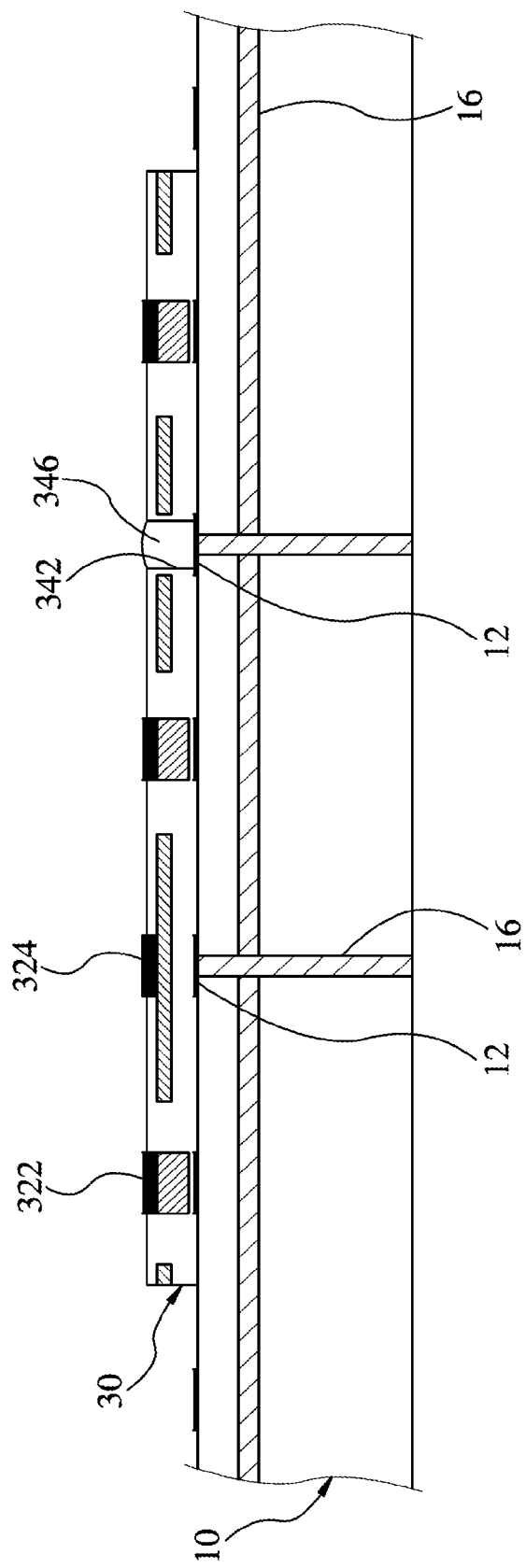
FIG. 5B is a diagram illustrating cross-sectional view along the line 5B-5B in FIG. 4.

The grounding layer 34 receives the grounding voltage level from the tester through the plurality of the grounding contacts 324. As shown in FIG. 5A, the grounding contact 324 can be made in two different configuration. One configuration for the grounding contact 324 can be realized in the form of having an area of the grounding layer 34 positioned on the first testing contact 12 without being covered by the contacting layer 32. In other words, by disposing a blind hole 340 on the contacting layer 32 according to the position of the first testing contact 12, the grounding layer 34 can be exposed for electrically connecting to the tester and the exposed area on the grounding layer 34 forms the grounding contact 324. Another configuration for the grounding contacts is described as follow: by disposing a through hole 342 on the FPC substrate 300 according to the position of the first testing contact 12 and removing the part of the contacting layer 32 around the periphery of the through hole 342 for exposing the grounding layer 34, a room is provided for an electrical conductive soldering material, e.g. a metal block 344. The metal block 344 electrically connects the grounding layer 34 and the first testing contact 12, and the surface of the metal block 344 forms the grounding contact 324. In this way, the tester can transmit the grounding voltage level to the grounding layer 34 through the grounding contact 324, and the first testing contact 12 has the same grounding voltage level as the grounding voltage level of the grounding layer 34 due to the electrical connection of the metal block 344. Besides, since the metal block 344 is soldered for connecting the grounding layer 34 of the high-speed substrate 30 and the first testing contact 12 of the circuit substrate 10, the high-speed substrate 30 can be fixed/adhered onto the circuit substrate 10 more firmly or strongly. Alternatively, if the metal block 344 is not used or adopted, the tester can directly connect to the first testing contact 12 through the through hole 342 for transmitting the first testing signal or the grounding voltage level. In this way, the grounding layer 34 of the high-speed substrate 30 has to be electrically insulated from the grounding layer of the circuit substrate 10, which prevents the second testing signals transmitted on the high-speed substrate 30 from being intervened by the first testing signals transmitted on the circuit substrate 10. Additionally, in order to electrically insulate the grounding layer 34 of the high-speed substrate 30 from the grounding layer of the circuit substrate 10 for avoiding signal crosstalk, the grounding layer 34 of the high-speed substrate 30 can be modified so as not to be exposed to the through hole 342, as shown in FIG. 5B. The through hole 342 provides room for an electrically conductive material, e.g. a metal block 346. The metal block 346 electrically connects the first testing contact 12 for electrically connecting the first testing contact 12 to the tester but does not electrically connect the grounding layer 34 of the high-speed substrate 30. In this way, the high-speed substrate 30 can be fixed onto the circuit substrate 10 by the metal block 346 without signal interference from the circuit substrate 10.

Figure 6:
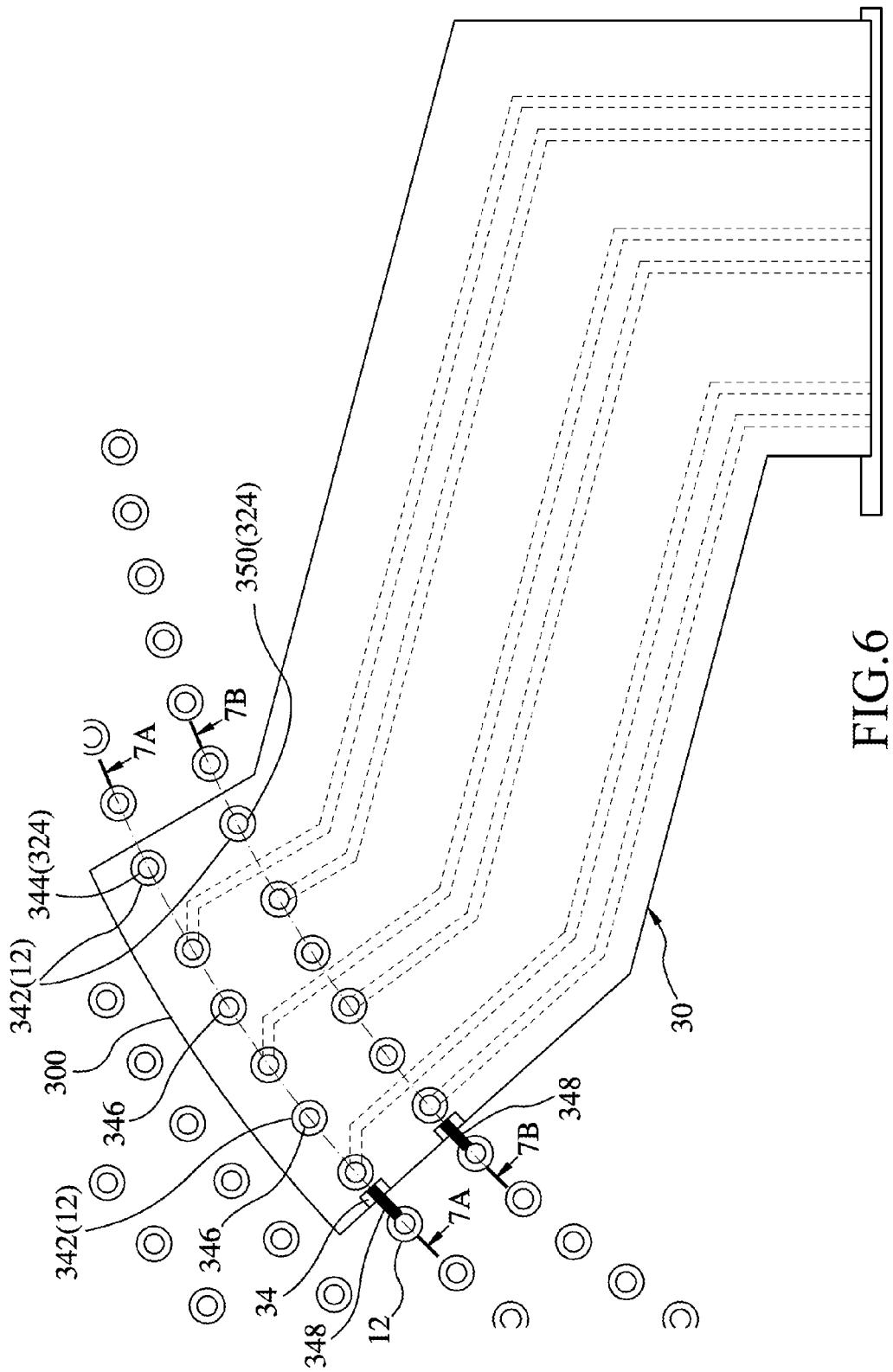
FIG. 6 is a diagram illustrating other modifications for electrically connecting the grounding layer of the high-speed substrate and the first testing contact of the circuit substrate while fixing the high-speed substrate onto the circuit substrate.
Figure 7A:
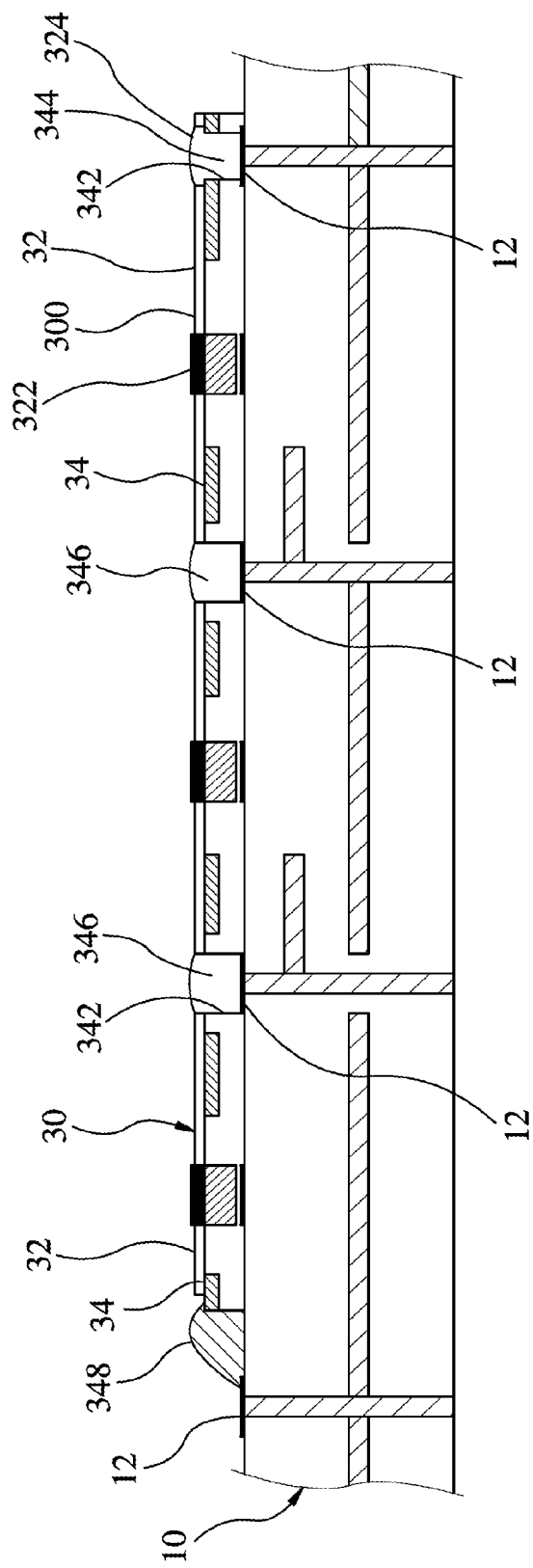
FIG. 7A is a diagram illustrating cross-sectional view along the line 7A-7A in FIG. 6.
Figure 7B:
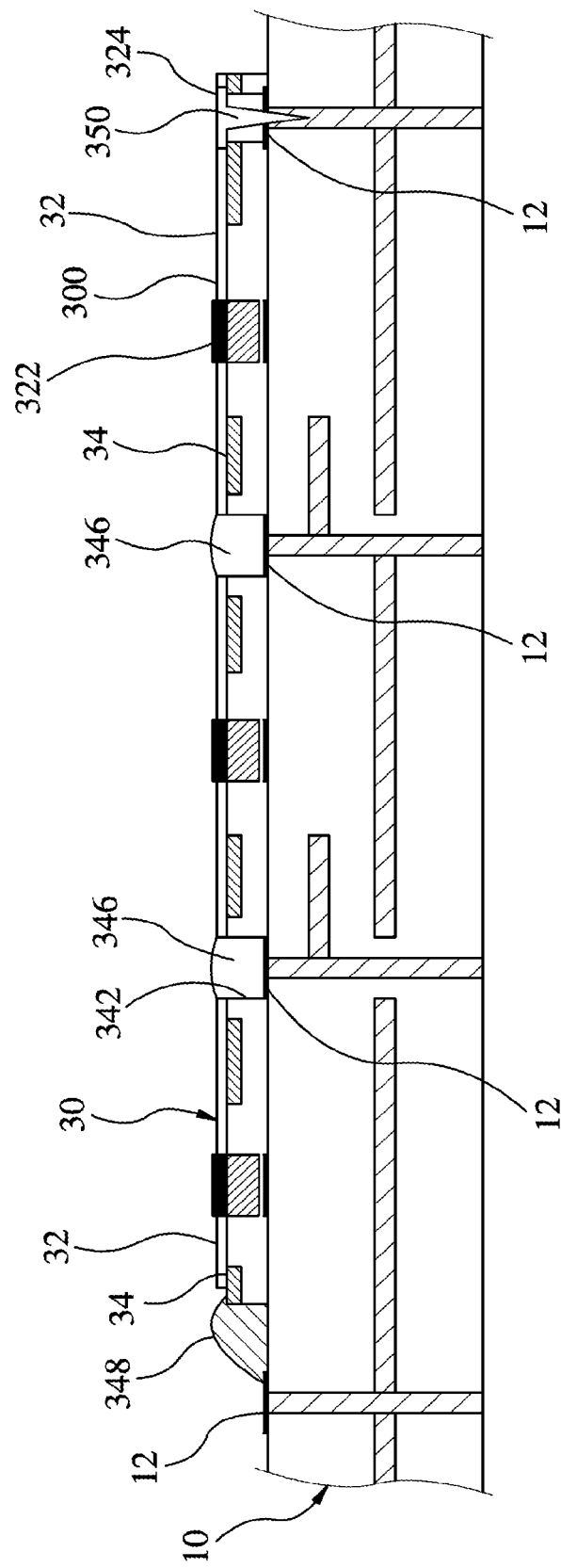
FIG. 7B is a diagram illustrating cross-sectional view along the line 7B-7B in FIG. 6.

Please refer to FIG. 6 and FIG. 7A~FIG. 7B. FIG. 6 and FIG. 7A~FIG. 7B shows other modifications for electrically connecting the grounding layer 34 of the high-speed substrate 30 and the first testing contact 12 of the circuit substrate 10 while fixing the high-speed substrate 30 onto the circuit substrate 10. As shown in FIG. 6 and FIG. 7A, at the side of the high-speed substrate 30, parts of the contacting layer 32 (where the second testing contact 322 and the grounding contact 324 are not disposed on) are removed to expose the grounding layer 34 of the high-speed substrate 30. A soldering material 348 is then disposed for electrically connecting the exposed grounding layer 34 of the high-speed substrate 30 to the first testing contact 12 of the circuit substrate 10 and fixing the high-speed substrate 30 onto the circuit substrate 10. In this way, the grounding voltage level of the grounding layer 34 of the high-speed substrate 30 will be the same as the grounding voltage level of the circuit substrate 10, and the high-speed substrate 30 also can be strongly fixed/adhered onto the circuit substrate 10. Meanwhile, the grounding layer 34 does not have to be completely configured around the through hole 342 and exposing so that those first testing contacts 12 covered by the high-speed substrate 30 can be electrically connected to the tester head through the through holes 342 or through the metal block 346. Since the metal block 346 is electrically insulated from the grounding layer 34, the first testing contact 12 covered by the high-speed substrate 30 can receive the first testing signal from the tester. Furthermore, as shown in FIG. 7A, as long as the signal wire 36 is not disposed near the side of the high-speed substrate 30, the grounding contact 324 of the contacting layer 32 of the high-speed substrate 30 can be disposed near the side of the high-speed substrate 30, and electrically connect to the grounding layer 34 and the first testing contact 12 by the metal block 344, and the metal block 344 also fixes the high-speed substrate 30 onto the circuit substrate 10.

Moreover, a metal fixing element can be used to fix the circuit substrate 10 and the high-speed substrate 30 together. Please refer to FIG. 7B. The grounding layer 34 of the high-speed substrate 30 is exposed by removing a part of the contacting layer 32 around the through hole 342, and a metal fixing element 350, e.g. metal spike, T-shaped needle, is disposed to abut against the surface of the exposed grounding layer 34. The tip of the metal fixing element 350 is embedded to the first testing contact 12, or further passes through the first testing contact 12 and is fixed at the lower surface 108 of the circuit substrate 10 by soldering. In this way, the exposed area of the metal fixing element 350 can form the grounding contact 324, the first testing contact 12 of the circuit substrate 10 can be electrically connected to the grounding layer 34 of the high-speed substrate 30 through the metal fixing element 350, and the high-speed substrate 30 is fixed/adhered onto the circuit substrate 10 by using the metal fixing element 350. However, the methods for fixing the high-speed substrate 30 onto the circuit substrate 10 can be same or different on each side of the high-speed substrate 30, as illustrated in the present embodiment.

Please refer to FIG. 3. Each signal wire 36 is disposed in the FPC substrate 300 along the extending direction of the high-speed substrate 30. More particularly, the signal wire 36 is disposed on a signal layer 360 and distant from the grounding layer 34 by having an electrical insulating layer 38 therebetween. The thickness of the insulating layer 38 is determined according to the frequency of the second testing signal. Preferably, one part of the signal wire 36 can be disposed in the signal layer 360 and the other part of the signal wire 36 can be disposed in the contacting layer 32 or on the surface of the contacting layer 32, and the thickness of the contacting layer 32 is determined according to the frequency of the second testing signal for increasing circuit space for high-frequency transmission. One end of the signal wire 36 electrically connects one corresponding second testing contact 322 of the contacting layer 32 and the other end of the signal wire 36 electrically connects one corresponding second probe contact 362 near the probe assembly 50 for transmitting the second testing signal from the tester. Each second probe contact 362 is disposed around one corresponding grounding probe contact 364 which electrically connects the grounding layer 34 as shown in FIG. 2. The grounding probe contact 364 can electrically connect the grounding layer 34 through the electrical insulating layer 38 for providing the grounding voltage level. Or, by removing a part of the electrical insulating layer 38 around the second probe contact 362, the exposed grounding layer 34 can be used as the grounding probe contact 364 for providing the grounding voltage level.

If the timing of two signals which are transmitted from the tester to the DUT or from the DUT to the tester are required to be synchronous, the signal wires 36 conveying such signals of timing issues have to be designed more precisely. For example, if the timing of two signals has to be synchronous and these two signals are conveyed by a pair of the signal wires 36, then the lengths of each signal wire of the pair have to be the same, and thus the layout for the pair of the signal wires become important. As shown in FIG. 2, one of the paired signal wires 36 conveying the clock signal is disposed along the other one of the paired signal wires 36, or each of the paired signal wires 36 changes its route in the same layer or different layers (the contacting layer 32 or the signal layer 360), so as to maintain their lengths to be the same for meeting the requirement for the clock signal.

Figure 8:
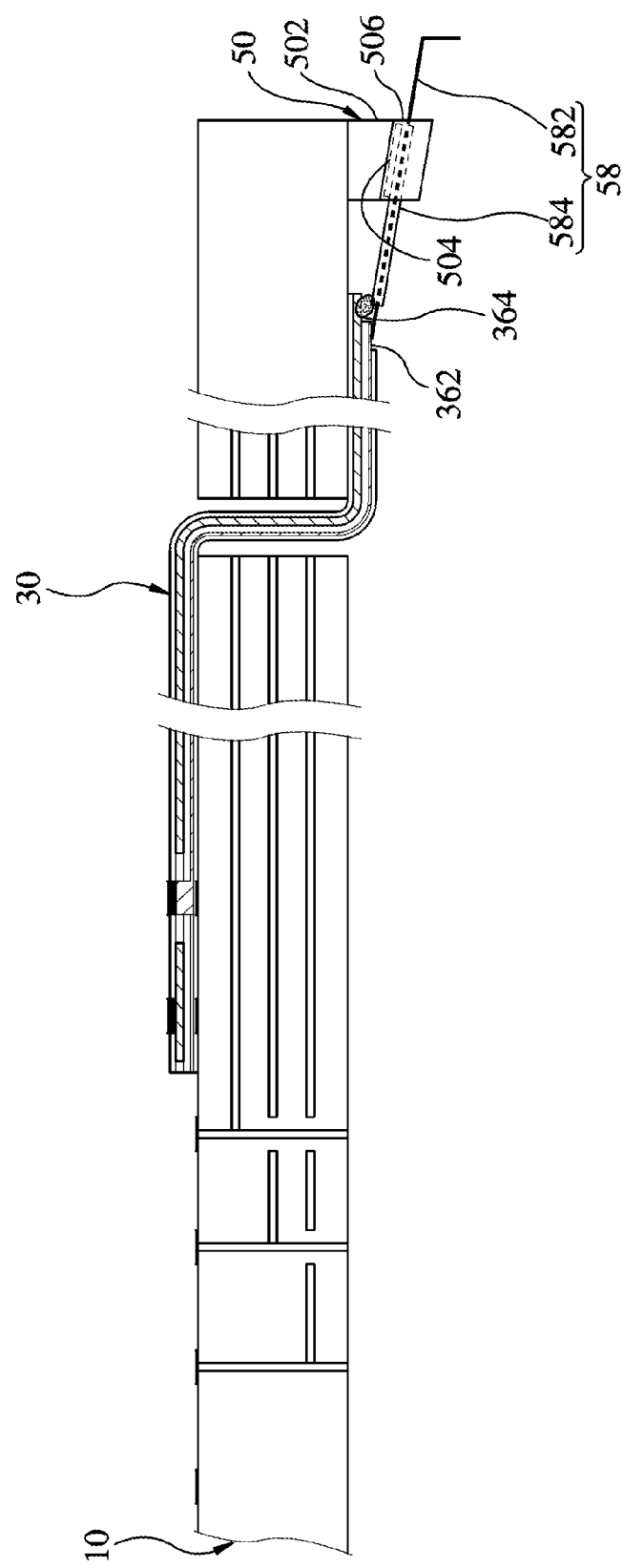
FIG. 8 is a diagram illustrating the structure of another second probe of the probe assembly of the present invention connecting the high-speed substrate.
Figure 9:
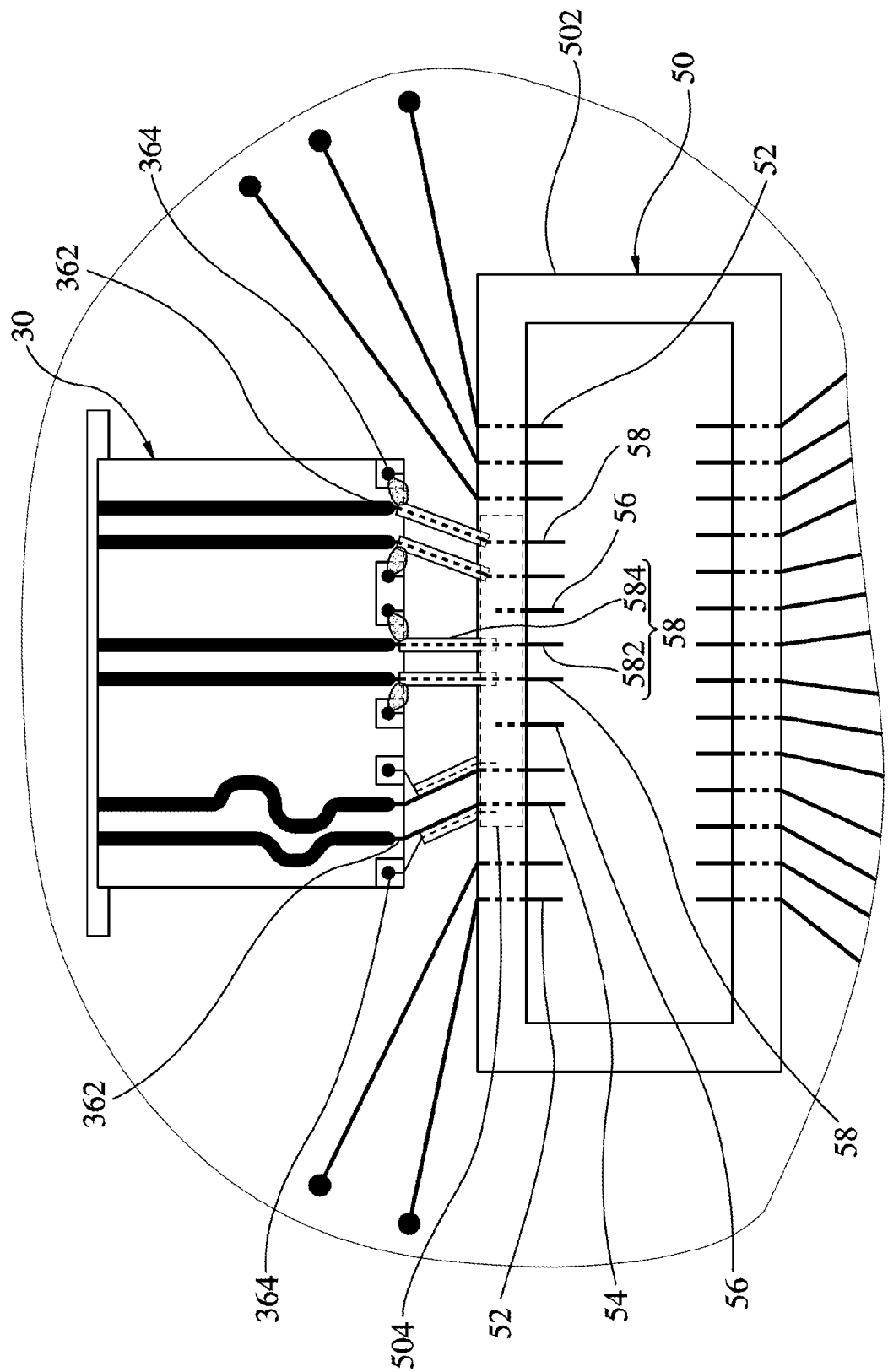
FIG. 9 is a diagram illustrating a partial bottom view of FIG. 8.

Please refer to FIG. 2 and FIG. 3. A locating base 502 of the probe assembly 50 is disposed with a plurality of first probes 52 and a plurality of second probes 54, and at least one grounding probe 56. The first probe 52 electrically connects the first probe contact 14 of the circuit substrate 10, and the second probe 54 comprises a metal probe 542 and a grounding metal material for high-frequency transmission. The metal probe 542 electrically connects the signal wire 36 of the high-speed substrate 30, and the grounding metal material electrically connects the grounding layer 34 of the high-speed substrate 30 and the grounding probe 56. The grounding metal material is configured to be attached to the metal probe 542 but electrically insulated from the metal probe 542. The grounding metal material of the second probe 54 can be realized with a grounding wire 544. The grounding wire 544 is contained in an electrical insulating material and is attached to the metal probe 542 through the electrical insulating material. More particularly, the electrical insulating material can be an electrical insulating tube for containing the grounding wire 544, and the electrical insulating tube is attached to the metal probe 542 so that the grounding wire 544 will be adjacent to the metal probe 542. Meanwhile, by attaching the electrical insulating tube to the metal probe 542, the distance between the metal probe 542 and the grounding wire 544 can be fixed. Additionally, another electrical insulating tube can be used to contain the metal probe 542 and the grounding wire 544, which are attached by the original electrical insulating tube, for further ensuring the distance between the metal probe 542 and the grounding wire 544 to be fixed. The metal probe 542 electrically connects the second probe contact 362 on the high-speed substrate 30, and the grounding wire 544 electrically connects the grounding probe contact 364 on the high-speed substrate 30. Since the second testing signal is the high-frequency testing signal and the transmission path for the high-frequency testing signal has to be adjacent to ground, the grounding metal material attaching to the metal probe 542 is required. However, the ground required for the high-frequency testing signal can be designed differently. For example, please refer to FIG. 8 and FIG. 9, the probe assembly 50 further comprises a second probe 58, and the second probe 58 comprises a metal probe 582 and a metal tube 584 coaxial with the metal probe 582, and the radius of the metal tube 584 is relatively small but the metal tube 584 is still electrically insulated from the metal probe 582. Besides, between the metal probe 582 and the metal tube 584, an electrical insulating material is filled in the metal tube 584 to ensure electrical insulation between the metal probe 582 and the metal tube 584. In other words, the metal tube 584 can be realized with an electrical insulating tube and a metal layer, and the electrical insulating tube is coated with the metal layer on its outer surface, and the metal probe 582 is positioned in the electrical insulating tube. The metal probe 582 electrically connects the second probe contact 362 of the high-speed substrate 30, and the metal tube 584 electrically connects the grounding probe contact 364. By such configuration, the metal probe 582 can transmit a second testing signal (high-frequency testing signal) between the tester and the DUT. In other words, as long as a metal probe is configured adjacent to a grounding metal material and electrically insulated from the grounding metal material, the metal probe is able to transmit the second testing signal.

Furthermore, for ensuring the grounding voltage level being provided to the second probe 54 during the high-frequency transmission, the probe assembly 50 further comprises a metal plate 504 on the locating base 502. The metal plate 504 electrically connects the grounding metal material of the second probe 54 and the grounding probe 56. The metal probe 542 of the second probe 54 is distant from the metal plate 504 by having an electrical adhesive 506, wherein the insulating adhesive 506 is attached to the metal probe 542 and the metal plate 504 for maintaining the distance between the metal probe 542 and the metal plate 504 to be fixed. Alternatively, the metal plate 504 can be further extended so as to directly connect the grounding metal material of the first probes 52. By such disposition, when the first testing signal is transmitted, the grounding voltage level at the DUT can be the same as the grounding voltage level provided from the high-speed substrate 30 for the second testing signal. In other words, the metal plate 504 ensures the grounding voltage levels respectively for the first and the second testing signals to be provided to the DUT for being the same, which increases testing accuracy.

Figure 10A:
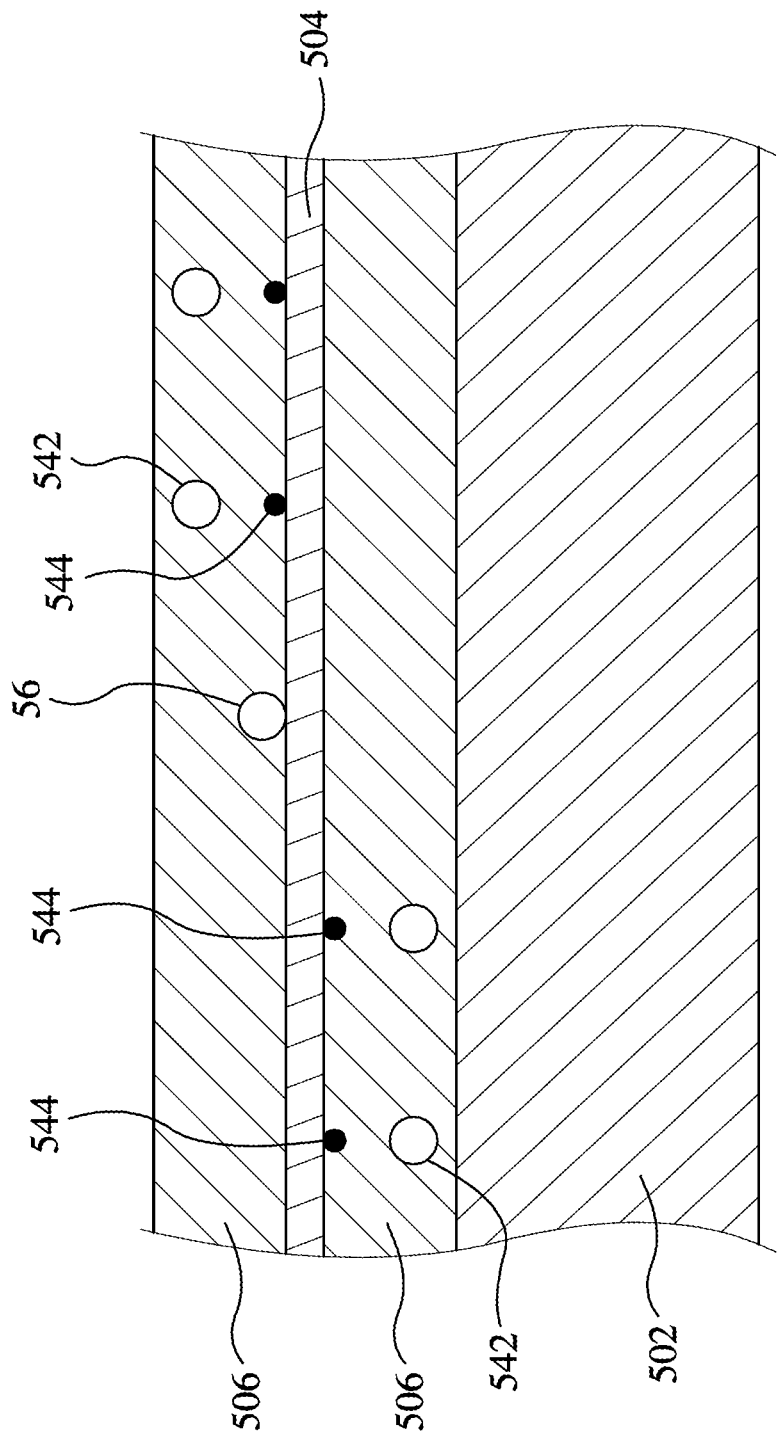
Figure 11A:
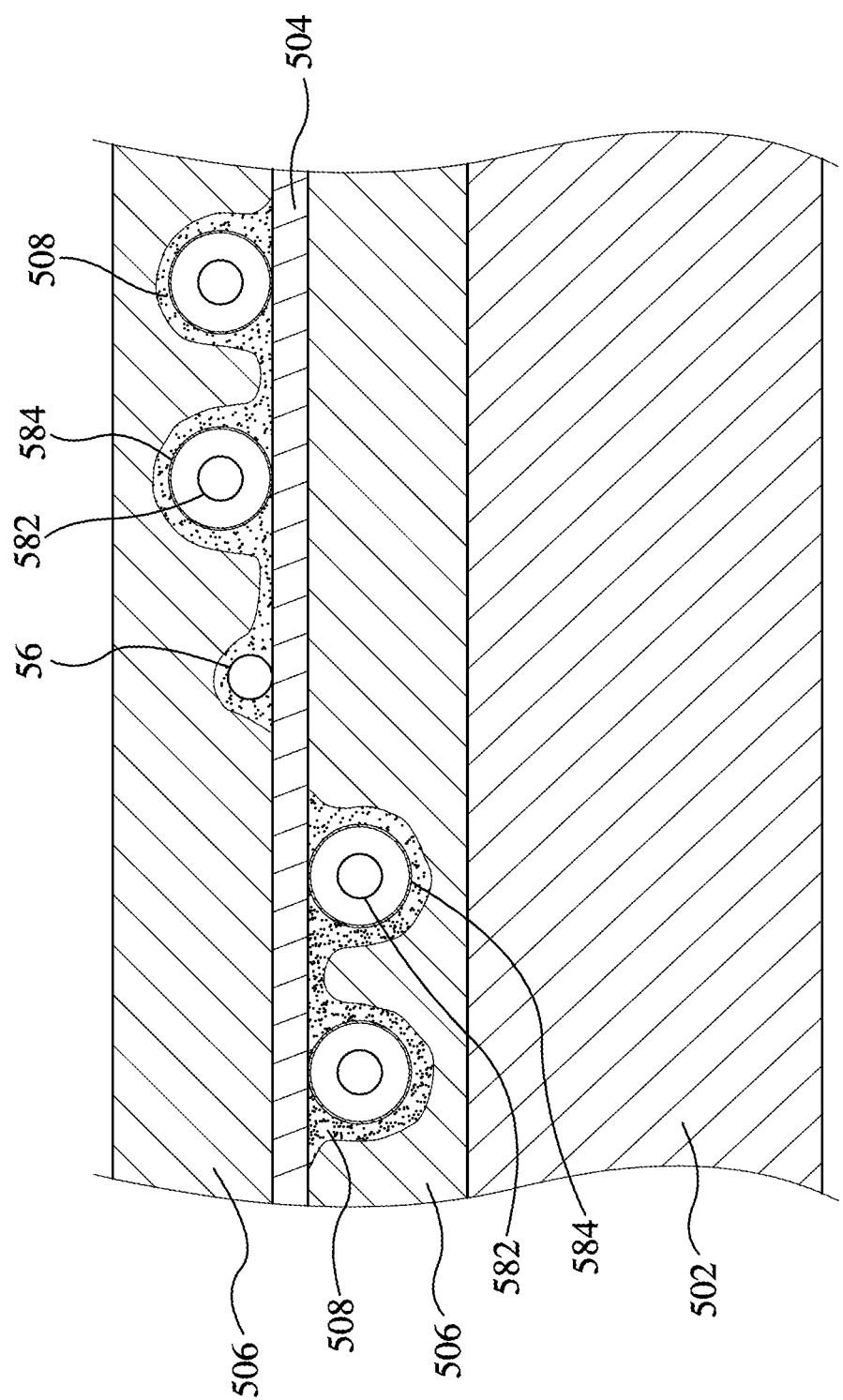
FIG. 11A and FIG. 11B are diagrams illustrating dispositions for another second probe in the probe assembly of the first embodiment of the present invention in FIG. 8.
Figure 11B:
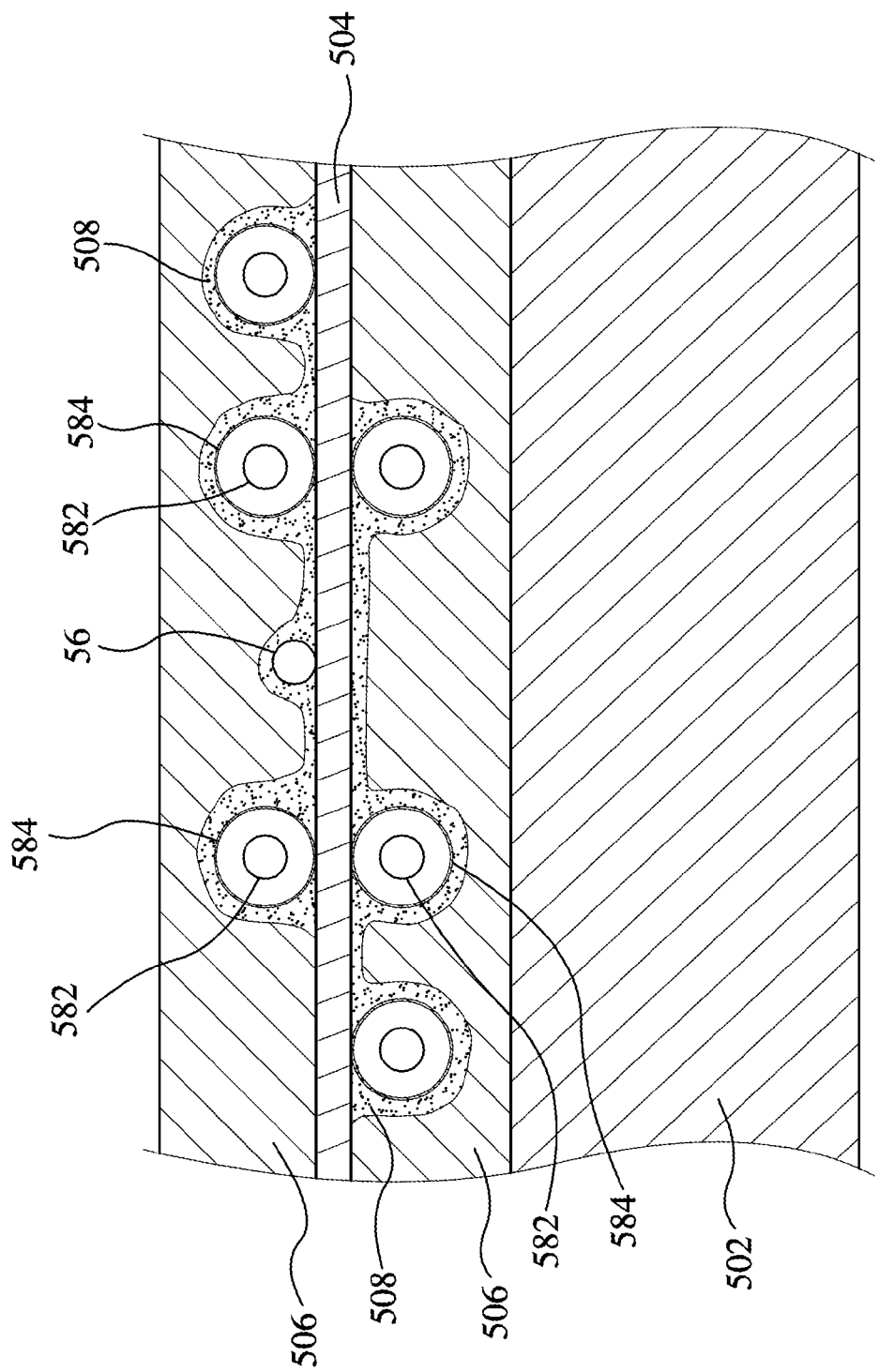

Additionally, the second probes 54 and 58 of the probe assembly 50 can be disposed on the locating base 502 and the arrangements for the second probes 54 and 58 are interlaced for high-density requirement, as shown in FIG. 10A and FIG. 10B (or FIG. 11A and FIG. 11B). In this way, the high-speed substrate 30 can effectively be adapted to high-frequency transmission. Please refer to FIGS. 10A and 10B, which show the disposition that the second probe 54 is made of the metal probe 542 and the grounding wire 544 which is parallel to the metal probe 542. The second probe 54 can be attached to the locating base 502 via the electrical insulating adhesive 506, and the distance between the metal probe 542 and the metal plate 504 can be adjusted through the configuration of the electrical insulating adhesive 506. More particularly, the electrical insulating adhesive 506 can be applied onto the locating base 502 for several times, and in each time of application of the electrical insulating adhesive 506 onto the locating base 502, an electrical insulating layer of a specific thickness is formed on the locating base 502. In this way, the second probe 54 can be attached to the locating base 502 after the electrical insulating adhesive 506 has been applied for a specific number of times, and the metal plate 504 can also be attached to the locating base 502 after the electrical insulating adhesive 506 has been applied for another specific number of times. By deciding the number of times which the electrical insulating adhesive 506 is applied onto the locating base 502 respectively for the second probe 54 and the metal plate 504, the distance between the second probe 54 and the locating base 502 can be appropriately decided, and the distance between the metal plate 504 and the locating base 502 can be appropriately decided as well. Besides, the grounding wire 544 parallel to the metal probe 542 can be attached to the metal plate 504, and the metal plate 504 can be attached to the locating base 502 by using the electrical insulating adhesive 506, and the distance between the metal plate 504 and the locating base 502 can be adjusted through the configuration of the electrical insulating adhesive 506. After the dispositions for the probes 52, 54, and 56 are done, the electrical insulating adhesive 506 will be solidified according to its natural characteristic, e.g. thermosetting or UV curing, onto the locating base 502. For low-density disposition, the electrical insulating adhesive 506 can be disposed to only one side of the metal plate 504 for attaching the second probe 54, thereby reducing the required thickness for the second probe 54 on the locating base 502. For the sake of reduction of crosstalk between each of the metal probes 542, the second probes 54 can be disposed interwoven-ly to each side of the metal plate 504, as shown in FIG. 10A. For high-density disposition, the second probes 54 can be disposed to each side of the metal plate 504, as shown in FIG. 10B.

FIG. 11A and FIG. 11B show dispositions of the second probes 58 on the locating base 502. The second probe 58 is made of a metal probe 582 and a metal tube 584, and the metal tube 584 surrounds the metal probe 582 and is coaxial with the metal probe 582. Since the metal probe 582 is disposed in the metal tube 584 and distant from the metal tube 584 by a specific distance for electrical insulation, the metal tube 854 can be attached onto the metal plate 504 via the electrical insulating adhesive 506 for electrically connecting the metal plate 504 and the metal probe 582 can be fixed as well. Besides, concerning the reduction of the area of the metal tube 584 contacting the metal plate 504 because of the surface of the metal tube 584 being curvy, an electrical conductive adhesive 508 can be utilized for attaching the metal tube 584 onto the metal plate 504 so as to increase the electrical connection between the metal tube 584 and the metal plate 504. After that, the electrical insulating adhesive 506 attaches the second probe 58 onto the locating base 502. After the dispositions for the probes 52, 54, 56, and 58 are done, the electrical insulating adhesive 506 is solidified according to its natural characteristic, e.g. thermosetting or UV curing, onto the locating base 502. For low-density disposition, the electrical insulating adhesive 506 can be disposed to only one side of the metal plate 504 for attaching the second probe 58, thereby reducing the required thickness for the second probe 58 on the locating base 502. Concerning the reduction of crosstalk between the metal probes 582, the second probes 58 can be disposed interwoven-ly to each side of the metal plate 504, as shown in FIG. 11A. For high-density disposition, the second probes 58 can be disposed to each side of the metal plate 504, as shown in FIG. 11B.

From the above description, it can be understood that in the integrated high-speed probe system 1 of the present invention, the FPC substrate 300 of the high-speed substrate 30 not only transmits the second testing signal from the tester to the DUT, but also is disposed with a through hole 342 aligned with the first testing contact 12 so that the tester transmits the first testing signal to those electrical components operating in low/medium-frequencies of the DUT at the same positions. In other words, the first testing signal from the tester can be transmitted to the DUT through the first testing contact 12 (while the high-speed substrate 30 covers most of the area of the circuit substrate 10), the first signal wire 16 of the circuit substrate 10, and the first probe 52 of the probe assembly 50, and second testing signal from the tester can be transmitted to the DUT through the second testing contact 322 of the FPC substrate 300 of the high-speed substrate 30. In this way, there is no need to dispose additional circuit space for high-transmission paths. Furthermore, the metal blocks 344 and 346 formed in the through holes 342 not only electrically connect the first testing contact 12 to the surface of the high-speed substrate 30 for the tester directly contacting the metal blocks 344 and 346, but also fix the high-speed substrate 30 onto the circuit substrate 10 more strongly.

Moreover, when the high-speed substrate 30 transmits the second testing signal, the grounding voltage level provided by the tester can be received by the grounding contact 324, and transmitted in the grounding layer 34 of the high-speed substrate 30 along with the second testing signal so as to maintain the impedance of the transmission path where the second testing signal is travelling on meets the requirement for high-frequency transmission. Alternatively, by exposing the grounding layer 34 in the through hole 342, the exposed grounding layer 34 can electrically connect the first testing contact 12 through the metal block 344 for the grounding layer 34 having the grounding voltage level equivalent to the grounding voltage level on the first testing contact 12, and the metal block 344 also provides the fixing of the high-speed substrate 30 and the circuit substrate 10. Thus, the tester can transmit testing signals of various different frequency bands to the DUT through the integrated high-speed probe system 1 with the high-speed substrate 30 and the circuit substrate 10.

Besides, since those circuit components of the high-speed substrate 30 described above are all disposed in the high-speed substrate 30, the surface of the high-speed substrate 30 is still able to further add other circuit components for adjusting the capacitive/inductive coupling of the transmission path where the second testing signal is travelling on. In this way, the integrated high-speed probe system 1 of one embodiment of the present invention can be adapted to DUT having different operating frequencies simply by adjusting capacitive/inductive coupling of the signal wire 36 and the grounding layer 34 of the high-speed substrate 30.

Figure 12:
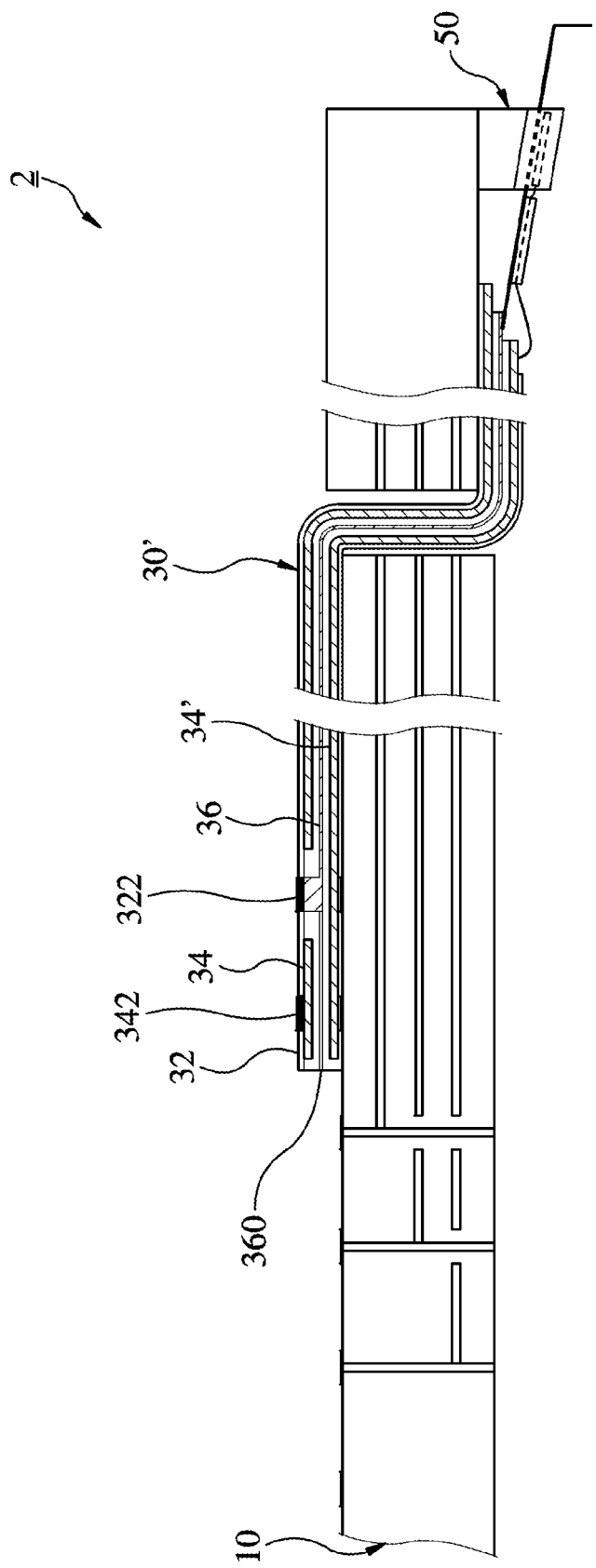
FIG. 12 is a diagram illustrating a second embodiment of the present invention.

Please refer to FIG. 12. FIG. 12 shows an integrated high-speed probe system 2 according to another embodiment of the present invention. The integrated high-speed probe system 2 comprises a high-speed substrate 30' disposed on the circuit substrate 10 and is configured to be adjacent to the probe assembly 50. Similar to the high-speed substrate 30 in the previous embodiment, the high-speed substrate 30' comprises a contacting layer 32, a grounding layer 34, and a signal layer 360, and a part of the plurality of the signal wires 36 are disposed in the signal layer 360 and another part of the plurality of the signal wires 36 are disposed in/on the contacting layer 32. Different from the high-speed substrate 30, an external grounding layer 34' is further disposed in the high-speed substrate 30'. As shown in FIG. 12, the grounding layer 34 is disposed at one side of the signal layer 360 and the external grounding layer 34' is disposed at the other side of the signal layer 360. In this way, the contacting layer 32 has its own corresponding grounding layer (the grounding layer 34) and the signal layer 360 has its own corresponding grounding layer (the external grounding layer 34') for transmitting the second testing signals on the signal wires 36 respectively. By doing so, one high-frequency transmission path (e.g. the contacting layer 32 and the grounding layer 34) will be more independent to the other high-frequency transmission path (e.g. the signal layer 360 and the external grounding layer 34') so that upon when one high-frequency transmission path is damaged, the other high-frequency path will not be effected. Besides, the power loss on the transmission paths of which the second testing signals are travelling on will be reduced.

Figure 13:
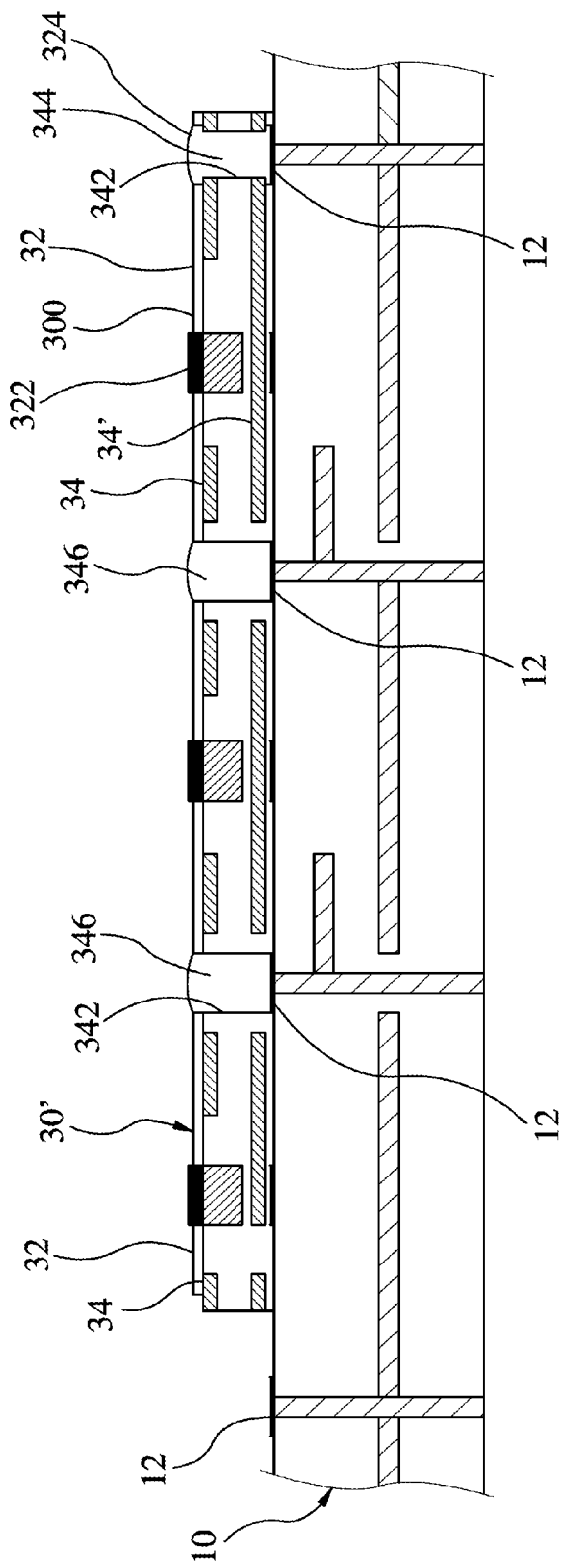
FIG. 13 is a diagram illustrating a partial cross-section view of the second embodiment of the present invention for showing the disposition of the high-speed substrate and the circuit substrate.

Please refer to FIG. 13. FIG. 13 shows the external grounding layer 34' of the high-speed substrate 30'. As shown in FIG. 13, the FPC substrate 300 of the high-speed substrate 30' is configured with the through holes 342. Each through hole 342 is aligned with one corresponding testing contact 12. By removing a part of the contacting layer 32 around the through hole 342 and a part of the surface of the FPC substrate 300 around the through hole 342, the grounding layer 34 and the external grounding layer 34' are exposed in the through hole 342. Thus, the room provided by the through 342 can be filled with an electrical conductive soldering material, e.g. the metal block 344, for electrically connecting the grounding layer 34 and the external grounding layer 34' to the first testing contact 12, and (the surface of) the metal block 344 also can be seen as one grounding contact 324. In other words, the grounding contact 324 (the metal block 344) provides the grounding voltage level from the tester to the grounding layer 34 and the external grounding layer 34' respectively while also fixing the high-speed substrate 30' onto the circuit substrate 10.

Figure 14:
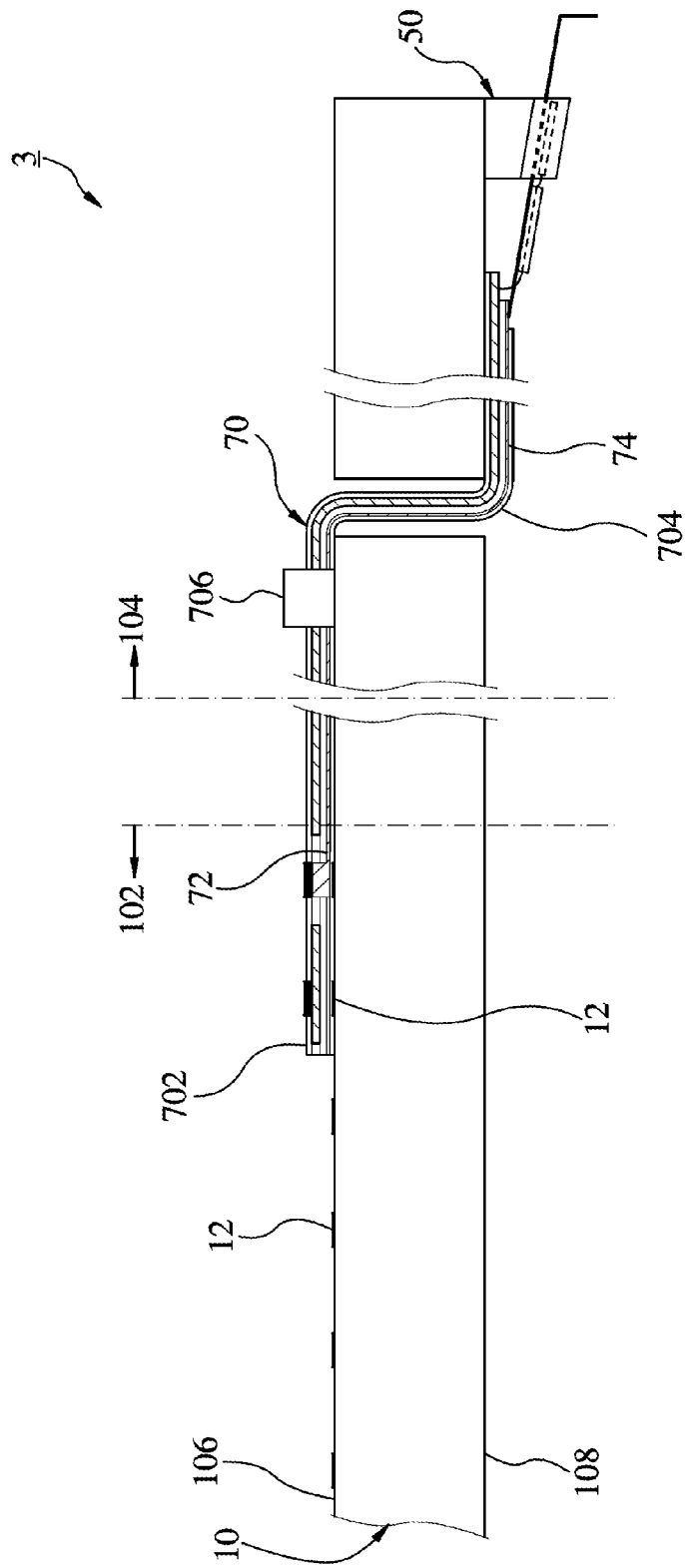
FIG. 14 is a diagram illustrating a third embodiment of the present invention.
Figure 15:
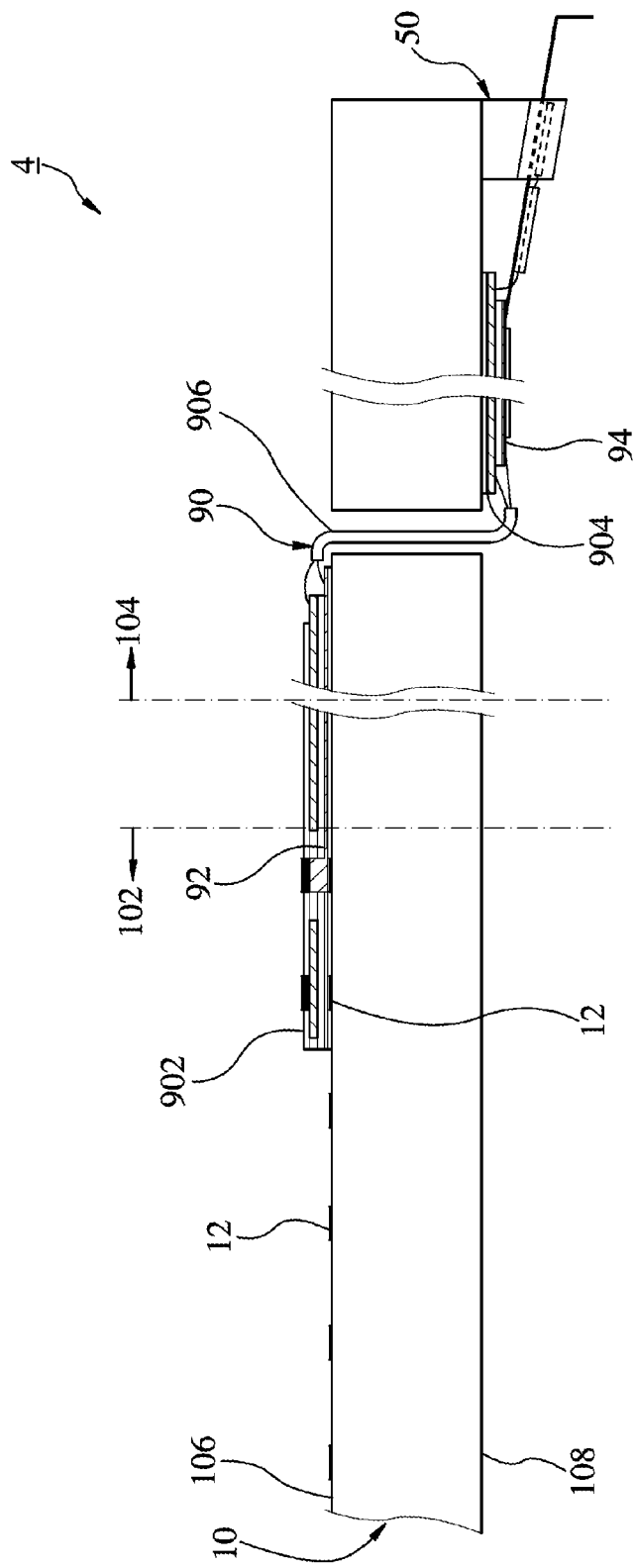
FIG. 15 is a diagram illustrating a fourth embodiment of the present invention.

It is noticeable that the high-speed substrate of the present invention can be realized with one single FPC substrate and the signal wires disposed in the FPC substrate can be designed according to the layout of the DUT, or can be realized with a plurality of FPC substrates as shown in FIG. 14 and FIG. 15. FIG. 14 and FIG. 15 show integrated high-speed probe systems 3 and 4 according to a third and a fourth embodiments according to the present invention, respectively. The integrated high-speed probe systems 3 and 4 comprise a high-speed substrate 70 and a high-speed substrate 90, respectively. The high-speed substrate 70/90 is disposed on the upper surface 106 and the lower surface 108 of the circuit substrate 10, as described in the previous embodiments. The high-speed substrate 70/90 comprises an FPC substrate 702, 902 which covers the most of the testing area 102 and the probe area 104, and also covers the first testing contact 12 of the circuit substrate 10, as described in the previous embodiments. Different from the FPC substrate described in the previous embodiments, the FPC substrate 702, 902 electrically connects another FPC substrate 704, 904 in the probe area 104, and the FPC substrate 704, 904 electrically connects the second probe 54 of the probe assembly 50 as described in the previous embodiments.

Please refer to FIG. 14. FIG. 14 shows a converter 706 disposed between the FPC substrates 702, 704 of the high-speed substrate 70. The converter 706 can be realized with a plurality of switching components arranged in an array for switching one signal wire 72 of a plurality of signal wires 72 of the FPC substrate 702 on the upper surface 106 of the circuit substrate 10 to one corresponding signal wire 74 of the plurality of signal wires 74 of the FPC substrate 704 on the lower surface 108 of the circuit substrate 10.

Please refer to FIG. 15. FIG. 15 shows a plurality of high-frequency transmission wires 906 disposed between the FPC substrates 902 and 904 of the high-speed substrate 90. Each high-frequency transmission wire 906 electrically connects one signal wire 92 of a plurality of signal wires 92 of the FPC substrate 902 on the upper surface 106 of the circuit substrate 10 to one corresponding signal wire 94 of the plurality of signal wires 94 of the FPC substrate 904 on the lower surface 108 of the circuit substrate 10.

Therefore, since the converter 706 (or the high-frequency transmission wire 906) is employed to adjust or modify the connection relationship between the signal wires 72 and 74 (or 92 and 94), the signal wires 72 and 74 (or 92 and 94) of the FPC substrates 702 and 704 (or 902 and 904) of the high-speed substrate 70 (or 90) can be designed without considering the layout of the DUT, which thereby accelerates the fabrication of the probe system 3 (or 4).

Figure 16:
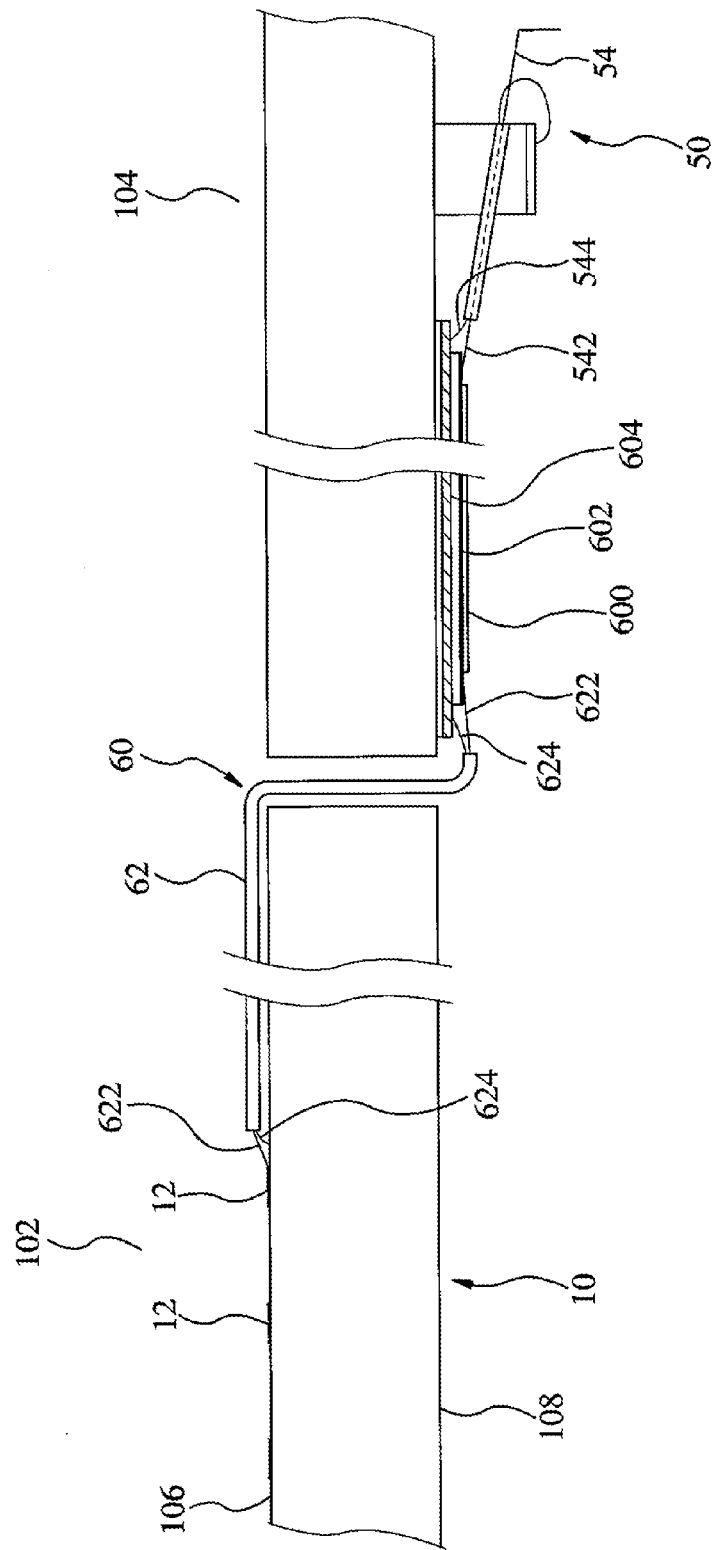
FIG. 16 is a diagram illustrating a fifth embodiment of the present invention.

Please refer to FIG. 16. FIG. 16 shows a high-speed substrate 60 according to a fifth embodiment of the present invention. The high-speed substrate 60 comprises one single FPC substrate 600 and a plurality of transmission wires 62. Different from the third and the fourth embodiments of the present invention, the single FPC substrate 600 is disposed on the lower surface 108 of the circuit substrate 10 and configured to be adjacent to the probe assembly 50 for electrically connecting the second probe 54 of the probe assembly 50. The FPC substrate 600 comprises a grounding layer 602 and a plurality of signal wires 604, as the same as described in the previous embodiments. The grounding layer 602 electrically connects the grounding wire 544 of the second probe 54, and the signal wire 604 electrically connects the metal probe 542 of the second probe 54.

A part of the transmission wire 62 is disposed on the upper surface 106 of the circuit substrate 10, another part of the transmission wire 62 is disposed in the circuit substrate 10, and the other part of the transmission wire 62 is disposed on the lower surface 108 of the circuit substrate 10. Each transmission wire 62 comprises a metal wire 622 and a grounding wire 624, which is electrically insulated from the metal wire 622. One end of the metal wire 622 electrically connects the first testing contact 12 and the other end of the metal wire 622 electrically connects the signal wire 604 of the FPC substrate 600. One end of the grounding wire 624 electrically connects the first testing contact 12 for receiving the grounding voltage level from the tester and the other end of the grounding wire 624 electrically connects the grounding layer 602 of the FPC substrate 600.

In the present embodiment, the plurality of the transmission wires 62 are disposed in the area other than the probe area 104 which is the area of high circuit density and the transmission wires 62 are realized by hand wires. In this way, the disposed hand wires can be modified for the high-speed substrate 60 to be adapted to DUTs of different fabrications/frequencies. Besides, the FPC substrate 600 is configured to be adjacent to the probe assembly 50 so as to avoid probe damages during the fabrication of the probe cards as found in the prior art.

Figure 17:
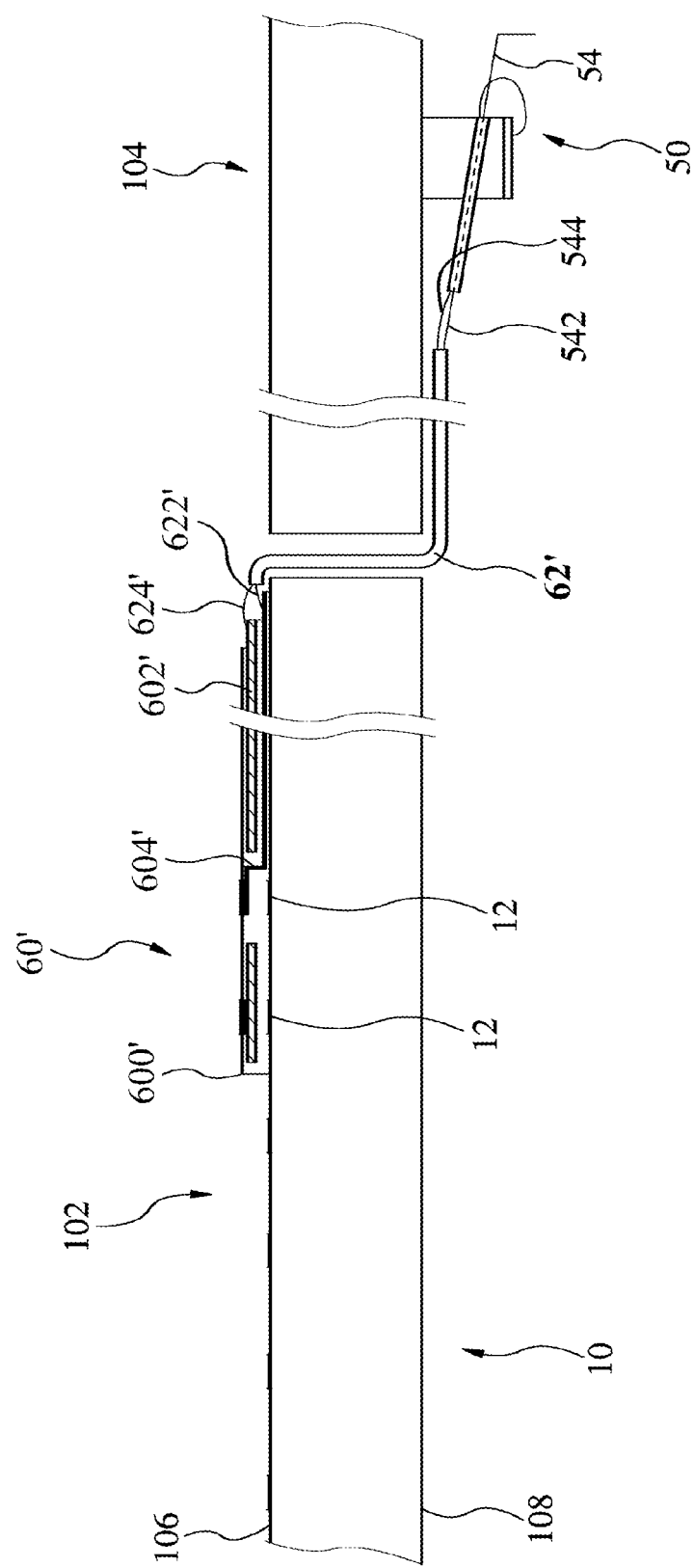
FIG. 17 is a diagram illustrating a sixth embodiment of the present invention.

Please refer to FIG. 17. FIG. 17 shows a high-speed substrate 60' according to a sixth embodiment of the present invention. The high-speed substrate 60' also has similar features as disclosed in the previous embodiments. The high-speed substrate 60' is also realized with a single FPC substrate 600' and a plurality of transmission wires 62', wherein the transmission wires 62' can be, without being limited to, realized by coaxial cables. Difference between the high-speed substrates 60 and 60' is described as follows.

The FPC substrate 600' extends from the upper surface 106 of the circuit substrate 10 in the testing area 102, and covers the first testing contacts 12 of the circuit substrate 10. Similarly, the FPC substrate 600' comprises a grounding layer 602' and a plurality of signal wires 604', wherein one end of each signal wire 604' is exposed for forming a corresponding second probe contact, and one end of the grounding layer 602' is also exposed for forming a corresponding grounding contact. Then, the grounding layer 602' and each signal wire 604' electrically connect each second probe 54 through each transmission wire 62'. More particularly, the transmission wires 62' extends between the upper surface 106 and the lower surface 108 of the circuit substrate 10, and each transmission wire 62' comprises a metal wire 622' and a grounding wire 624' which is electrically insulated from the metal wire 622'. One end of each metal wire 622' electrically connects a corresponding second probe contact of the PFC substrate 600' (the exposed part of the signal wire 604') and the other end of each wire 622' electrically connects the metal probe 542 of a corresponding second probe 54. One end of each grounding wire 624' electrically connects a corresponding grounding contact of the FPC substrate 600' (the exposed part of the grounding layer 602') and the other end of each grounding wire 624' electrically connects the grounding wire 544 (or the metal tube) of a corresponding second probe 54. Such design also achieves the purpose/function of the present invention. If the requirement for the transmission frequency is not too high, the second probe 54 can be realized with the metal probe 542 alone, and thus the grounding wire 544 can be omitted. Meanwhile, one end of each metal wire 622' electrically connects a corresponding second probe contact of the FPC substrate 600' and the other end of each metal wire 622' electrically connects a corresponding metal probe 542; one end of each grounding wire 624' electrically connects a corresponding grounding contact of the FPC substrate 600' and the other end of each grounding wire 624' electrically connects a corresponding grounding probe (not shown). Besides, such design also supports differential mode operation. In other words, two of the metal probes 542 can be paired up as a differential pair for transmitting differential signals. The grounding layer 602' of the FPC substrate 600' can further electrically connect at least one of the first testing contacts 12, as shown in FIG. 7A, wherein the first testing contacts 12 receive the grounding voltage level from the tester.

Additionally, each embodiment of the present invention applies not only to single-DUT, but also to multi-DUT, thereby providing greater convenience.

Those skilled in the art will readily observe that numerous modifications and alterations of the device and method may be made while retaining the teachings of the invention. Accordingly, the above disclosure should be construed as limited only by the meters and bounds of the appended claims.

What is claimed is:

1. An integrated high-speed probe system for transmitting a grounding voltage level, a first testing signal, and a second testing signal from a tester for testing a device under test (DUT), the first testing signal having a first frequency different from a second frequency of the second testing signal, the integrated high-speed probe system comprising:

a circuit substrate being divided into a probe area and a testing area from a center of the circuit substrate to a periphery of the circuit substrate, the circuit substrate comprising:
an upper surface;
a lower surface;
a plurality of first testing contacts on the upper surface within the testing area for transmitting the first testing signal or the grounding voltage level; and
a plurality of first probe contacts on the lower surface within the probe area for electrically connecting the plurality of the first probe contacts;
a high-speed substrate extending from the upper surface of the circuit substrate in the testing area to the lower surface of the circuit substrate in the probe area by passing through the circuit substrate for being adjacent to the center of the circuit substrate, the high-speed substrate comprising:
a contacting layer comprising a plurality of second testing contacts configured on the upper surface of the circuit substrate;
a grounding layer for receiving the grounding voltage level; and
a plurality of signal wires electrically connected to the plurality of the second testing contacts for transmitting the second testing signal;
wherein at least one of the plurality of the second testing contacts is aligned with one corresponding first testing contact of the circuit substrate; and
a probe assembly comprising:
a locating base;
at least one grounding probe located on the locating base for electrically connecting the grounding layer of the high-speed substrate;
a plurality of first probes, each first probe electrically connected to a corresponding first probe contact of the circuit substrate;
a plurality of second probes, each second probe electrically connected one corresponding signal wire of the high-speed substrate.

2. The integrated high-speed probe system of claim 1, wherein a metal plate is further disposed on the locating base, and the metal plate electrically connects the grounding probe; each first probe electrically connects one corresponding first probe contact of the circuit substrate; each second probe comprises a metal probe and a grounding metal material; the metal probe electrically connects one corresponding signal wire of the high-speed substrate; the grounding metal material is configured adjacent to the metal probe of the second probe and electrically insulated from the metal probe of the second probe, and the grounding metal material electrically connects the grounding layer of the high-speed substrate and the metal plate of the locating base.

3. The integrated high-speed probe system of claim 1, wherein the high-speed substrate comprises at least one grounding contact configured to be aligned with one corresponding first testing contact of the circuit substrate, and the grounding layer of the high-speed substrate electrically connects the grounding contact of the high-speed substrate.

4. The integrated high-speed probe system of claim 3, wherein the grounding contact of the high-speed substrate is disposed in the contacting layer or the grounding layer of the high-speed substrate.

5. The integrated high-speed probe system of claim 4, wherein a blind hole is further disposed on the grounding layer of the high-speed substrate, and is aligned with one corresponding first testing contact of the circuit substrate; the grounding contact is formed in the grounding layer of the high-speed substrate and exposed by the blind hole.

6. The integrated high-speed probe system of claim 2, wherein the high-speed substrate is configured adjacent to the probe assembly on the lower surface of the circuit substrate; one end of each signal wire is exposed for forming a second probe contact, and the metal probe of the second probe is electrically connected to the second probe contact; the grounding layer of the high-speed substrate is configured adjacent the second probe contact and exposed for forming a grounding probe contact; one end of the grounding metal material is disposed to the grounding probe contact.

7. The integrated high-speed probe system of claim 1, wherein the high-speed substrate further comprises a circuit component disposed on a surface of the high-speed substrate for adjusting a capacitive characteristic or an inductive characteristic of the second testing signal.

8. The integrated high-speed probe system of claim 1, wherein the high-speed substrate is realized by a first flexible printed circuit (FPC) substrate and a second FPC substrate; the first FPC substrate extends on the upper surface of the circuit substrate and the contacting layer and the grounding layer are disposed in the first FPC substrate; the second FPC substrate extends on the lower surface of the circuit substrate for being adjacent to the probe assembly and comprises a second grounding layer; each signal wire is divided into a first part and a second part; the first part of each signal wire is disposed in the first FPC substrate, and the second part of each signal wire is disposed in the second FPC substrate; the second grounding layer of the second FPC substrate electrically connects the grounding layer of the first FPC substrate.

9. The integrated high-speed probe system of claim 2, wherein the grounding metal material of each second probe is realized with a grounding wire or a metal tube; the grounding wire is adjacent and configured along the metal probe; the metal tube surrounds the metal probe and is coaxial with the metal probe; and the metal tube is realized with an electrical insulating tube and a metal layer coated on an output surface of the electrical insulating tube and the metal probe is positioned in the electrical insulating tube.

10. The integrated high-speed probe system of claim 9, wherein the second probes are disposed at a same side of the metal plate or different sides of the metal plate, and the grounding metal material attaches to the metal plate.

11. The integrated high-speed probe system of claim 10, wherein the grounding metal material of each second probe is realized with a grounding wire; the probe assembly comprises an electrical insulating material for fixing the metal probe of the second probe to be adjacent to the metal plate at a specific distance.

12. The integrated high-speed probe system of claim 10, wherein the grounding metal material of each second probe is realized with a metal tube; the probe assembly comprises an electrical conductive adhesive for fixing the metal tube of the second probe to the metal plate.

13. The integrated high-speed probe system of claim 1, wherein the high-speed substrate is further disposed with a through hole to configured a corresponding first testing contact of the circuit substrate, and the through hole is disposed with a metal block for fixing the high-speed substrate onto the circuit substrate, and the metal block electrically connects the first testing contact; the grounding layer of the high-speed substrate is exposed by the through hole and electrically connects the metal block; a part of the metal block forms a corresponding grounding contact; at least one of the through holes is configured adjacent to a side of the high-speed substrate.

14. The integrated high-speed probe system of claim 1, wherein the high-speed substrate is further disposed with a through hole configured to a corresponding first testing contact of the circuit substrate, and the grounding layer of the high-speed substrate is exposed by the through hole; the through hole is disposed with a metal fixing component; the metal fixing component electrically connects the grounding layer of the high-speed substrate and the corresponding first testing contact of the circuit substrate, and abut against an exposed surface of the grounding layer of the high-speed substrate and passes through the corresponding first testing contact of the circuit substrate; a part of the metal fixing component is exposed from the contacting layer of the high-speed substrate for forming a corresponding grounding contact of the high-speed substrate; at least one of the through holes is configured adjacent to a side of the high-speed substrate.

15. The integrated high-speed probe system of claim 1, wherein the grounding layer of the high-speed substrate is exposed at a side of the high-speed substrate for electrically connecting one corresponding first testing contact and fixing the high-speed substrate onto the circuit substrate.

16. The integrated high-speed probe system of claim 1, wherein a signal layer is further disposed between the contacting layer of the high-speed substrate and the grounding layer of the high-speed substrate; at least one of the signal wires is disposed in the contacting layer; and at least one of the signal wires is disposed in the signal layer.

17. The integrated high-speed probe system of claim 16, wherein the high-speed substrate further comprises an external grounding layer, the signal layer is disposed between the grounding layer and the external grounding layer, and the high-speed substrate is further disposed with a through hole adjacent to one corresponding first testing contact of the circuit substrate; the grounding layer and the external grounding layer of the high-speed substrate are exposed by the through hole; a metal block is further disposed to the through hole for electrically connecting the grounding layer and the first testing contact of the circuit substrate.

18. The integrated high-speed probe system of claim 16, wherein a first signal wire of the plurality of the signal wires of the high-speed substrate is disposed in the contacting layer and a second signal wire of the plurality of the signal wires of the high-speed substrate is disposed in the grounding layer, and the first signal wire is aligned with the second signal wire.

19. The integrated high-speed probe system of claim 16, wherein at least a length of a first signal wire of the plurality of the signal wires of the high-speed substrate is equal to a length of a second wire of the plurality of the signal wires of the high-speed substrate; the first signal wire and the second signal wire are disposed in the contacting layer or the grounding layer of the high-speed substrate.

20. The integrated high-speed probe system of claim 1, wherein the high-speed substrate is realized with an FPC substrate and a plurality of transmission wires; the FPC substrate extends on the lower surface of the circuit substrate; the plurality of the transmission wires extend on the upper surface and the lower surface of the circuit substrate; one end of each transmission wire electrically connects one corresponding first testing contact of the circuit substrate and other end of each transmission wire electrically connects a corresponding signal wire of the FPC substrate; the corresponding testing contact is disposed for transmitting the second testing signal from the tester.

21. The integrated high-speed probe system of claim 1, wherein the high-speed substrate is realized with an FPC substrate and a plurality of transmission wires; the FPC substrate extends on the upper surface of the circuit substrate and the contacting layer, the grounding layer, and the plurality of the signal wires are disposed in the FPC substrate; the plurality of the transmission wires extend on the upper surface and the lower surface of the circuit substrate; each transmission wire comprises a signal transmission wire and a grounding transmission wire; one end of each signal transmission wire electrically connects a corresponding signal wire of the high-speed substrate and other end of each signal transmission wire electrically connects a corresponding second probe of the probe assembly; one end of each grounding transmission wire electrically connects the grounding layer of the high-speed substrate and other end of each grounding transmission wire electrically connects a corresponding grounding probe of the probe assembly.

* * * * *

UNITED STATES PATENT AND TRADEMARK OFFICE
CERTIFICATE OF CORRECTION

PATENT NO. : 8,884,640 B2  
APPLICATION NO. : 13/450460  
DATED : November 11, 2014  
INVENTOR(S) : Chun-Chi Wang et al.

Page 1 of 1

It is certified that error appears in the above-identified patent and that said Letters Patent is hereby corrected as shown below:

In the Specification

Column 2, lines 52-54, "a plurality of first probe contacts on the lower surface within the probe area for electrically connecting the plurality of the first probe contacts" should be amended to read --a plurality of first probe contacts on the lower surface within the probe area for electrically connecting the plurality of the first testing contacts--

In the Claims

Column 14, lines 10-12 of claim 1, "a plurality of first probe contacts on the lower surface within the probe area for electrically connecting the plurality of the first probe contacts" should be amended to read --a plurality of first probe contacts on the lower surface within the probe area for electrically connecting the plurality of the first testing contacts--

Signed and Sealed this  
Twenty-fourth Day of February, 2015

Michelle K. Lee  
*Deputy Director of the United States Patent and Trademark Office*